United States Patent
Kozaki

(10) Patent No.: US 6,882,211 B2
(45) Date of Patent: Apr. 19, 2005

(54) OUTPUT CIRCUIT, INPUT CIRCUIT, ELECTRONIC CIRCUIT, MULTIPLEXER, DEMULTIPLEXER, WIRED-OR CIRCUIT, WIRED-AND CIRCUIT, PULSE-PROCESSING CIRCUIT, MULTIPHASE-CLOCK PROCESSING CIRCUIT, AND CLOCK-MULTIPLIER CIRCUIT

(75) Inventor: Minoru Kozaki, Suwa (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 10/359,021

(22) Filed: Feb. 5, 2003

(65) Prior Publication Data

US 2004/0008073 A1 Jan. 15, 2004

(30) Foreign Application Priority Data

Feb. 6, 2002 (JP) ...................................... 2002-029953

(51) Int. Cl.[7] .............................................. H03K 17/62
(52) U.S. Cl. ....................................................... 327/407
(58) Field of Search .......................... 327/99, 403–405, 327/407–413, 365, 389, 293–294, 298

(56) References Cited

U.S. PATENT DOCUMENTS

| | | | | | |
|---|---|---|---|---|---|
| 5,789,966 | A | * | 8/1998 | Bechade | 327/407 |
| 5,835,045 | A | * | 11/1998 | Ogawa et al. | 341/155 |
| 5,955,912 | A | * | 9/1999 | Ko | 327/410 |
| 6,094,086 | A | * | 7/2000 | Chow | 327/396 |
| 6,160,437 | A | * | 12/2000 | Kim et al. | 327/408 |
| 6,166,583 | A | * | 12/2000 | Kochi et al. | 327/407 |
| 6,452,423 | B1 | * | 9/2002 | Das et al. | 326/113 |
| 6,489,825 | B1 | * | 12/2002 | Pasqualini | 327/211 |

* cited by examiner

*Primary Examiner*—My-Trang Nu Ton
(74) *Attorney, Agent, or Firm*—Harness, Dickey & Pierce, P.L.C.

(57) ABSTRACT

A circuit is provided to make the propagation delay time of each signal path substantially the same without using a low resistance process even when wiring lengths are different. In the circuit, output nodes a to d are individually disposed at the output side of transmission gates TG2, TG4, TG6, and TG8, these output nodes a to d are connected so as to have an equal wiring length, inverters IV11 and IV12 are disposed at the output nodes a and d, and a common node e is disposed at a position where the wiring length from each of the inverters IV11 and IV12 becomes identical.

2 Claims, 18 Drawing Sheets

[FIG. 1]
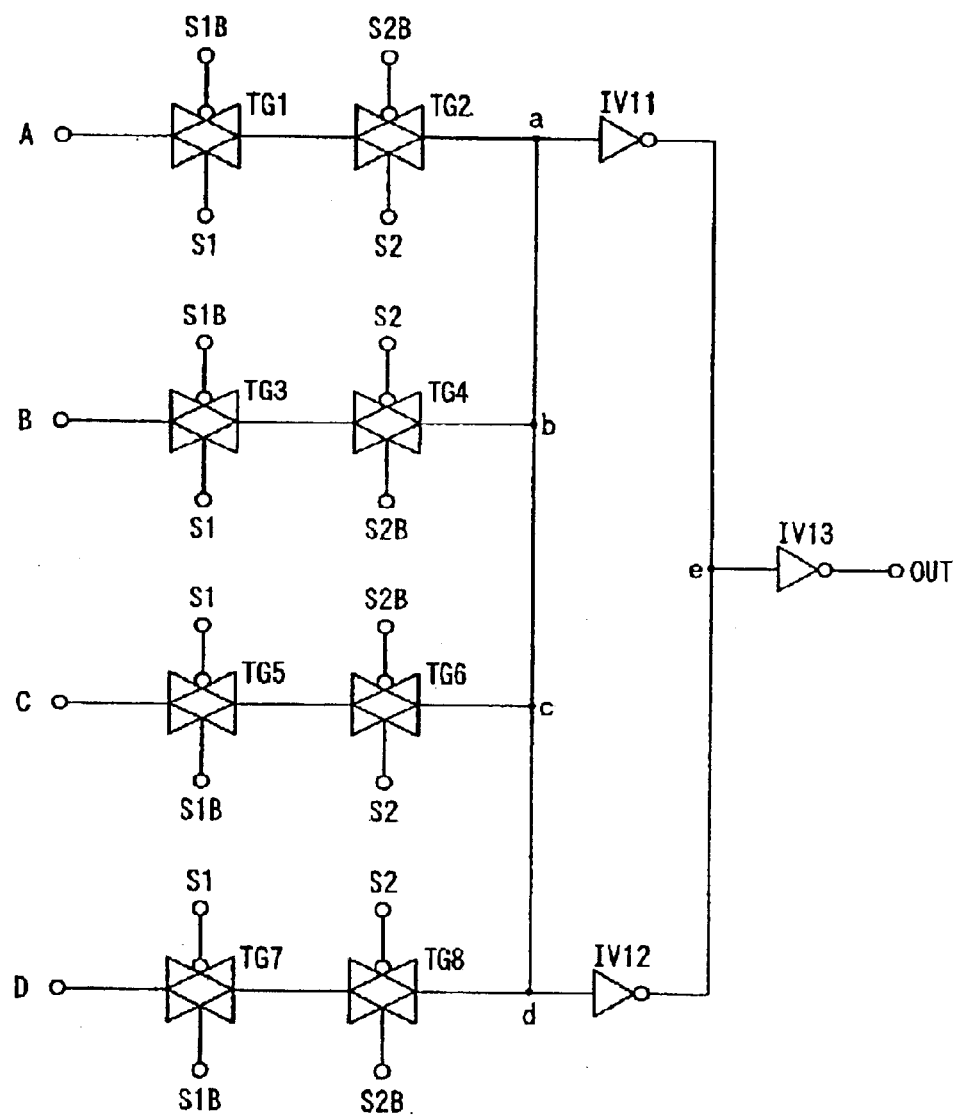

[FIG. 2]
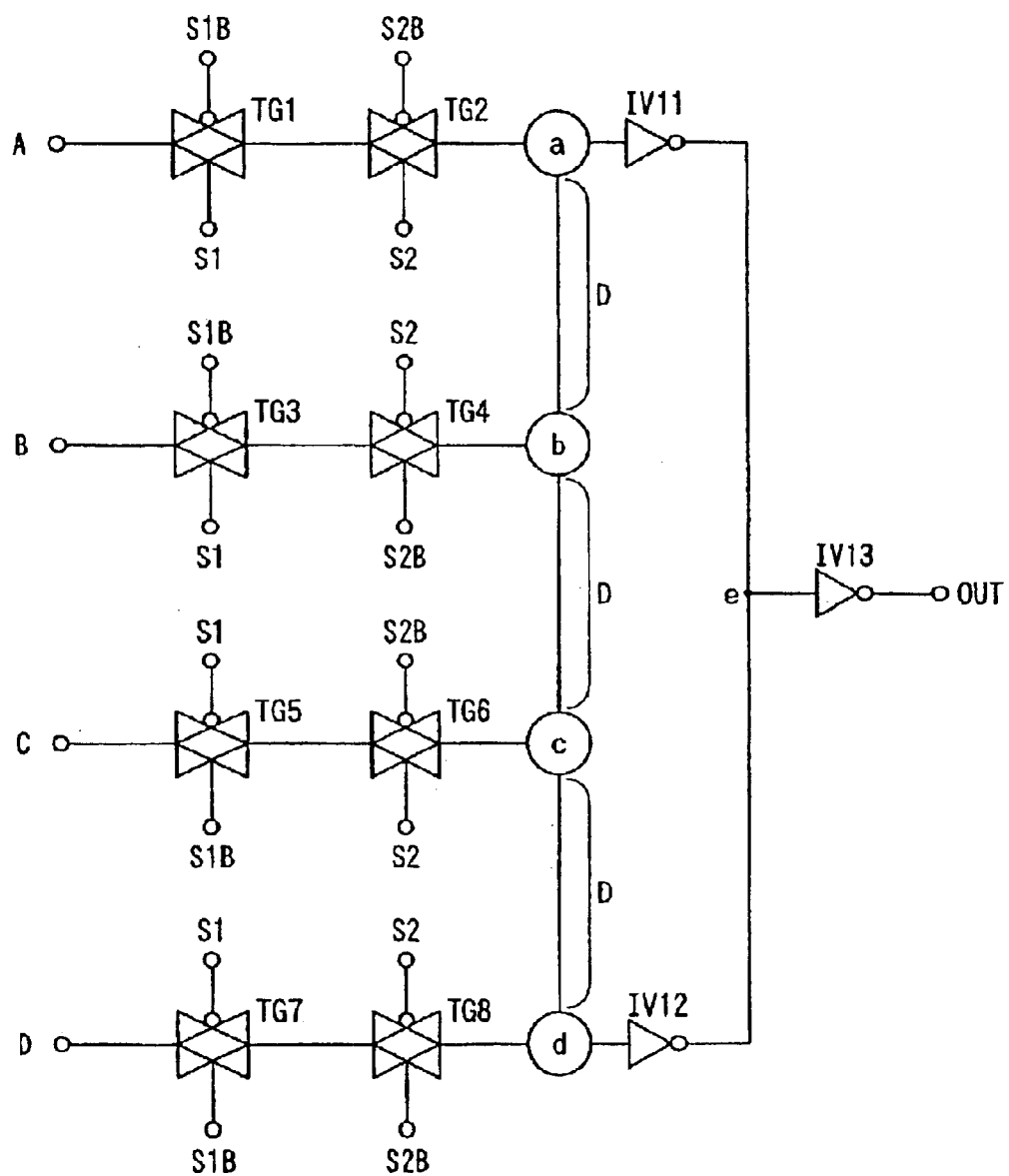

[FIG. 3]
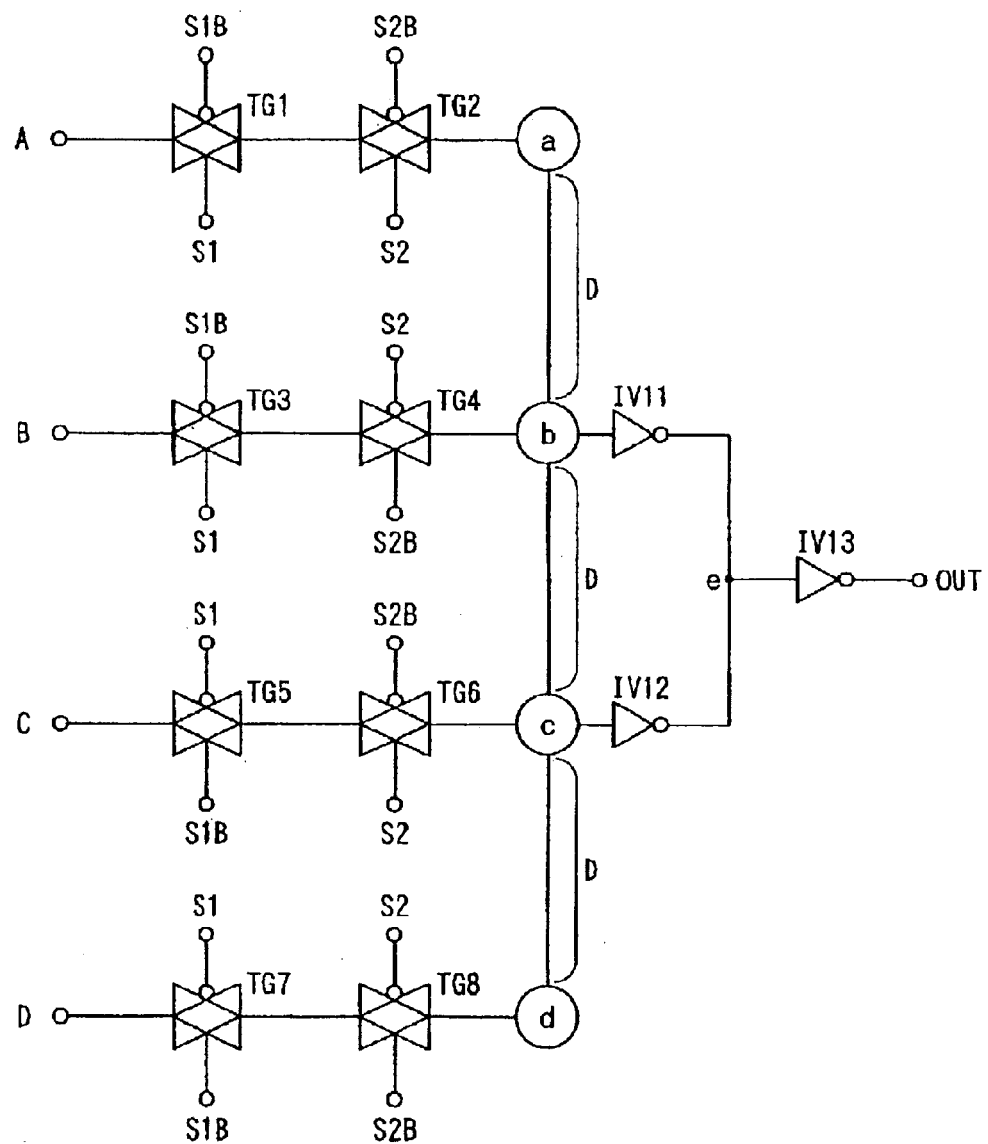

(FIG. 4)
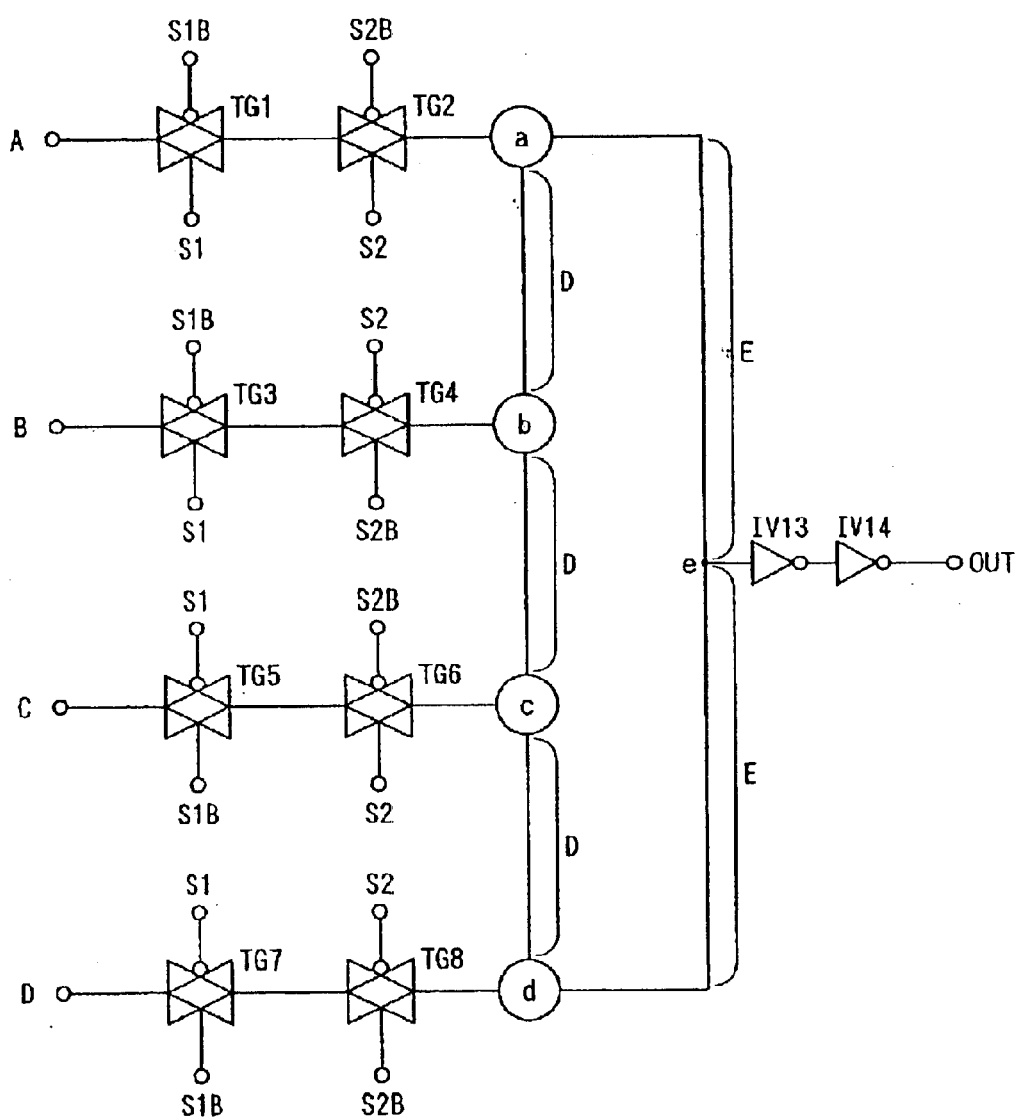

|   | DISTANCE TO IV11 | DISTANCE TO IV12 | AVERAGE DISTANCE |
|---|---|---|---|
| a | 0D | 3D | 1.5D |
| b | 1D | 2D | 1.5D |
| c | 2D | 1D | 1.5D |
| d | 3D | 0D | 1.5D |

(b)

|   | DISTANCE TO IV11 | DISTANCE TO IV12 | AVERAGE DISTANCE |
|---|---|---|---|
| a | 1D | 2D | 1.5D |
| b | 0D | 1D | 0.5D |
| c | 1D | 0D | 0.5D |
| d | 2D | 1D | 1.5D |

(c)

|   | PATH I | PATH II | PARALLEL RESISTANCE VALUE |
|---|---|---|---|
| a | E | 3D+E | $(E^2+3DE)/(3D+2E)$ |
| b | D+E | 2D+E | $(2D^2+E^2+3DE)/(3D+2E)$ |
| c | 2D+E | D+E | $(2D^2+E^2+3DE)/(3D+2E)$ |
| d | 3D+E | E | $(E^2+3DE)/(3D+2E)$ |

(FIG. 6)
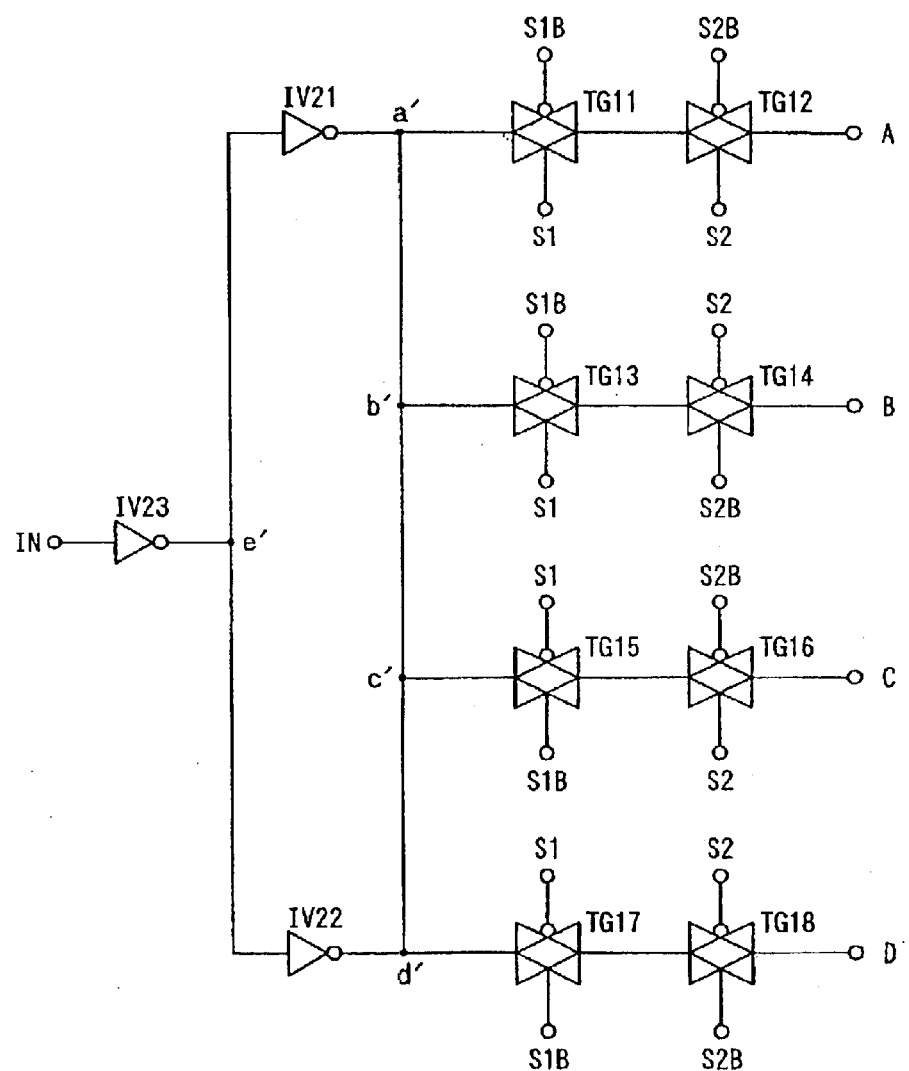

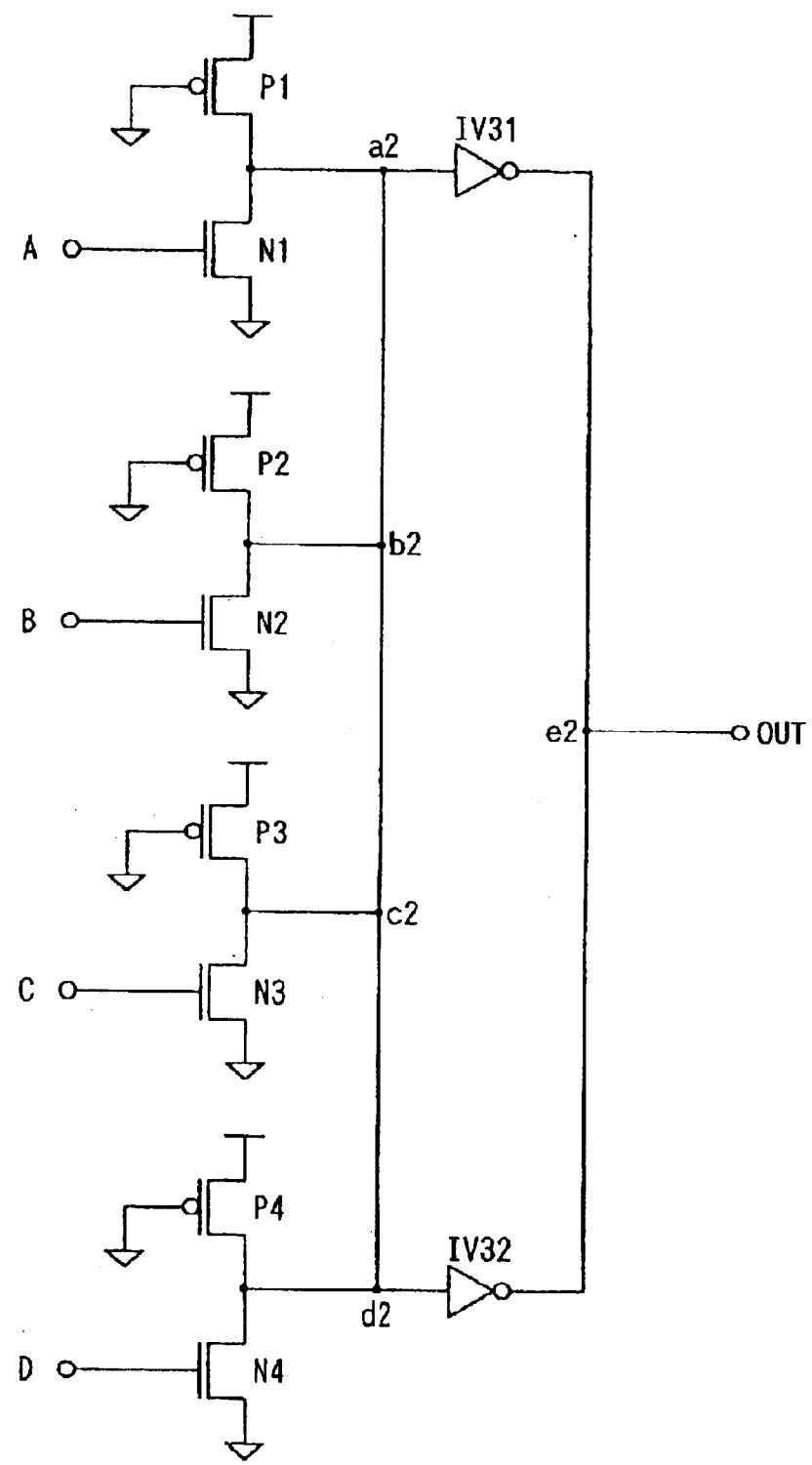
[FIG. 7]

[FIG. 8]
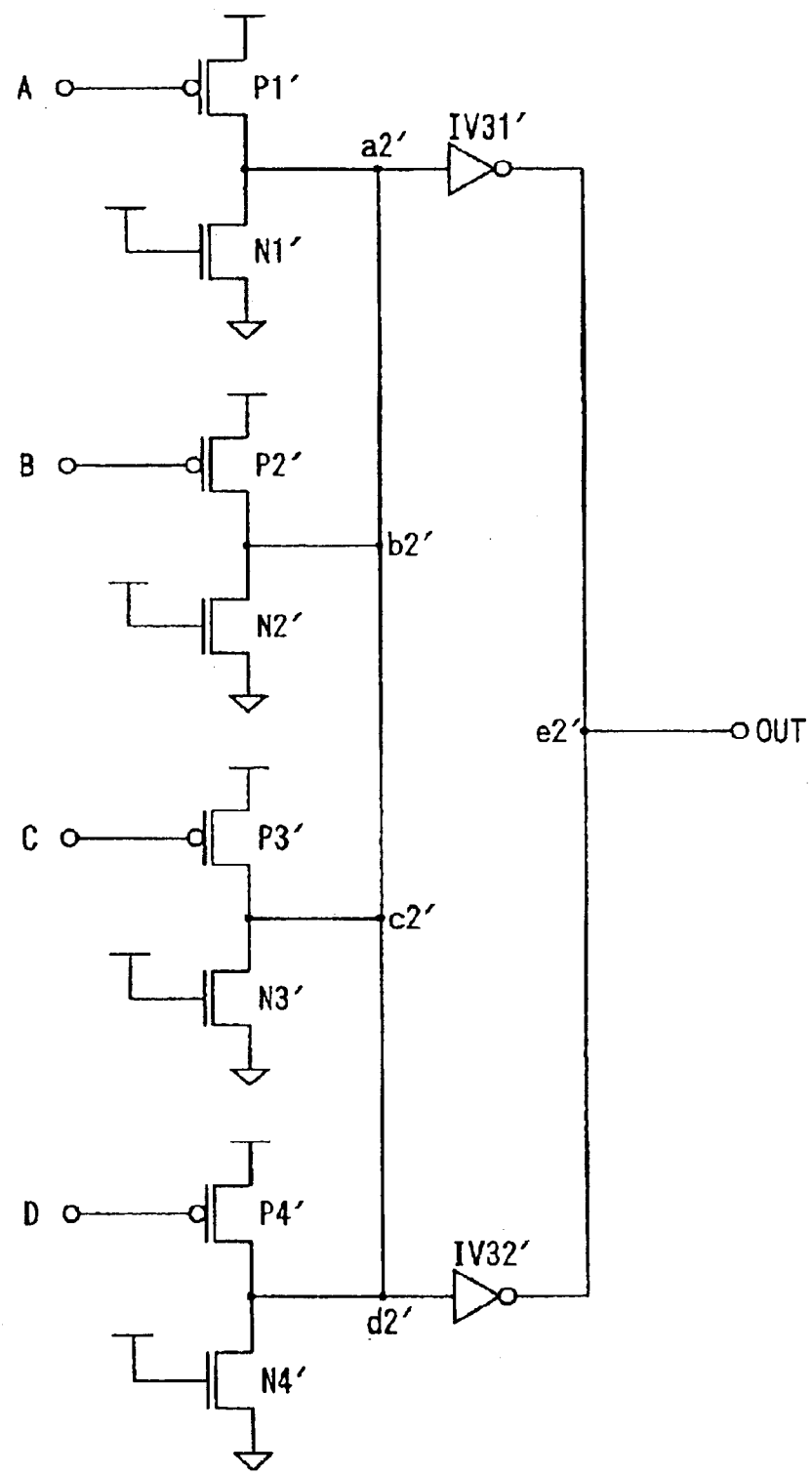

[FIG. 9]
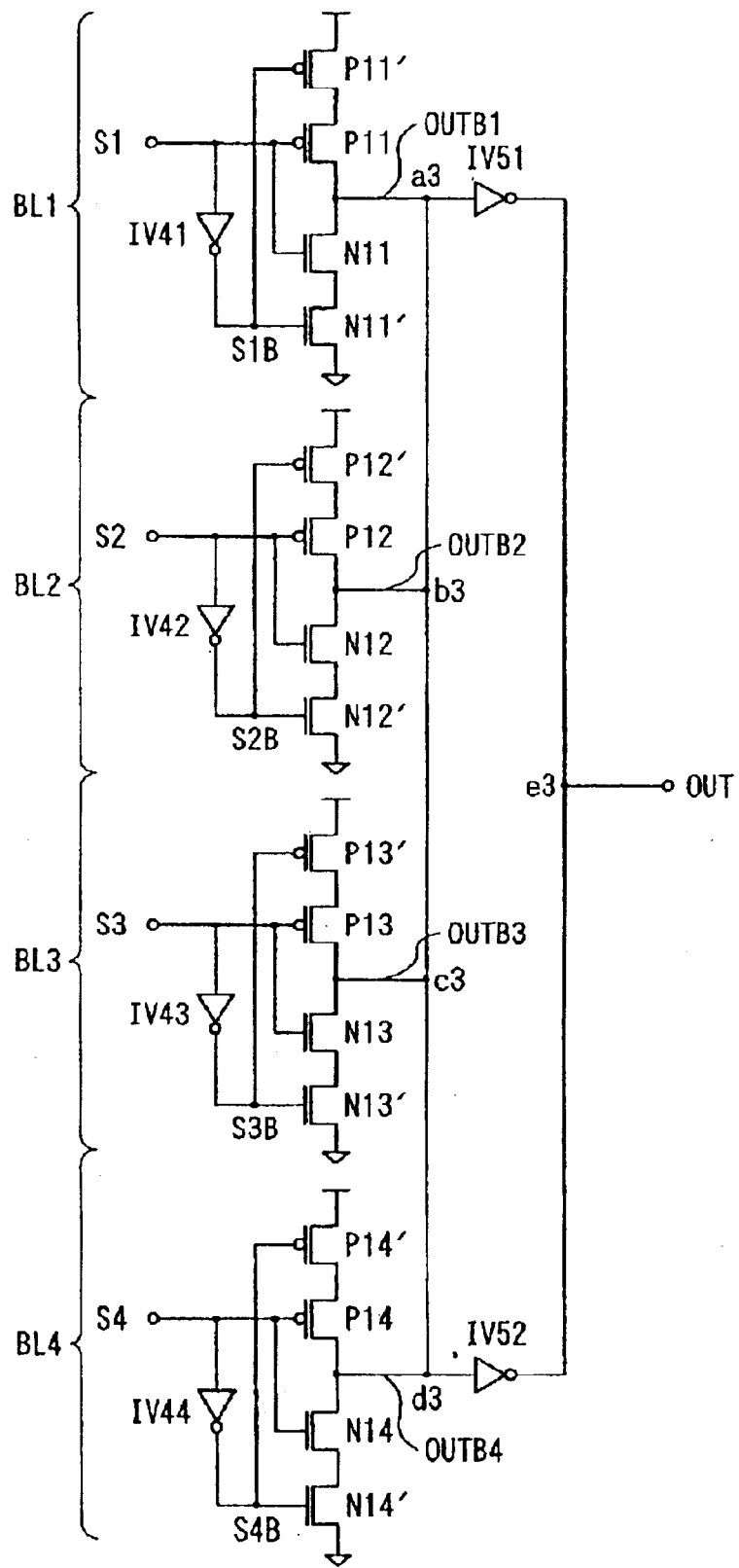

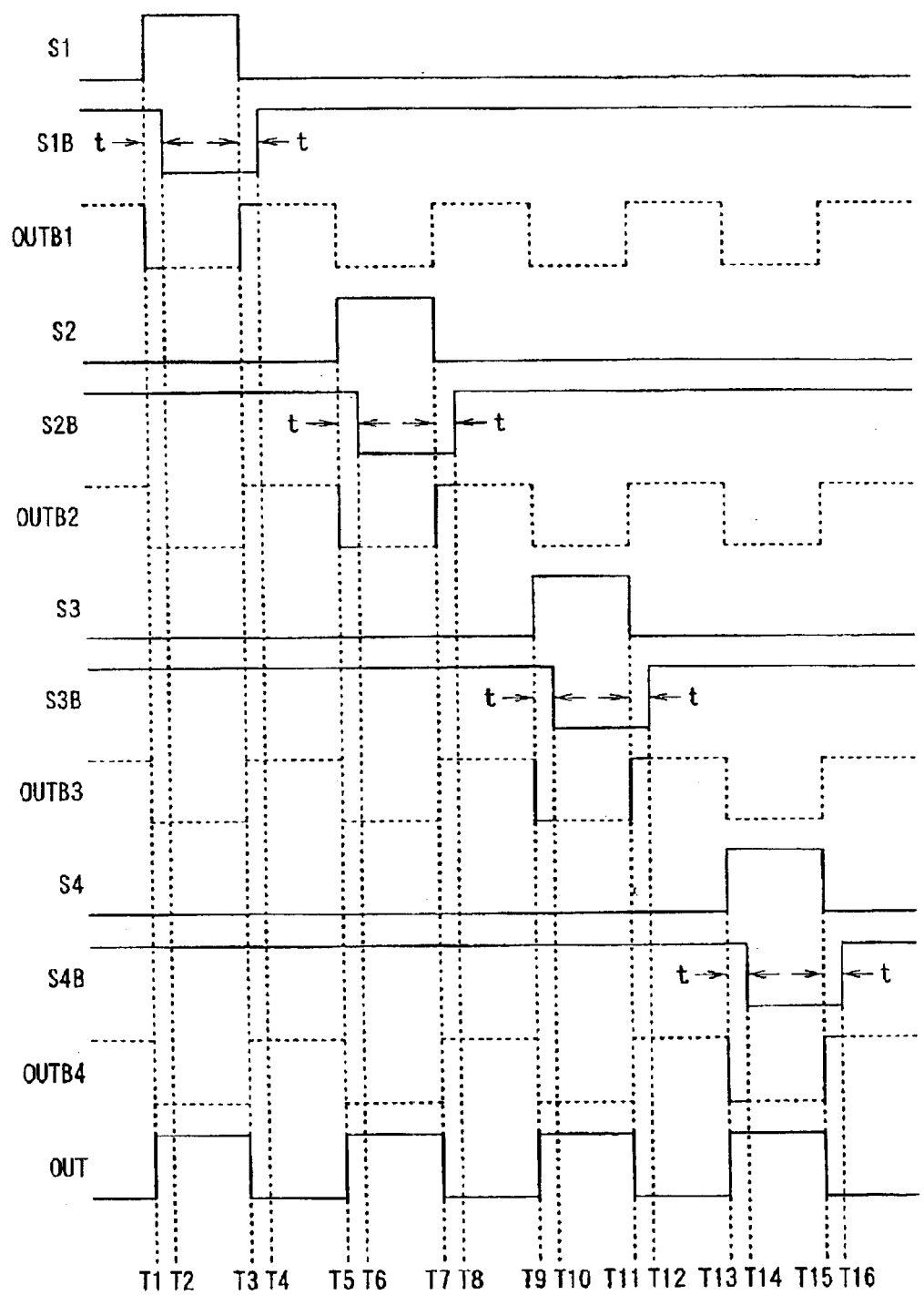
[FIG. 10]

[FIG. 11]
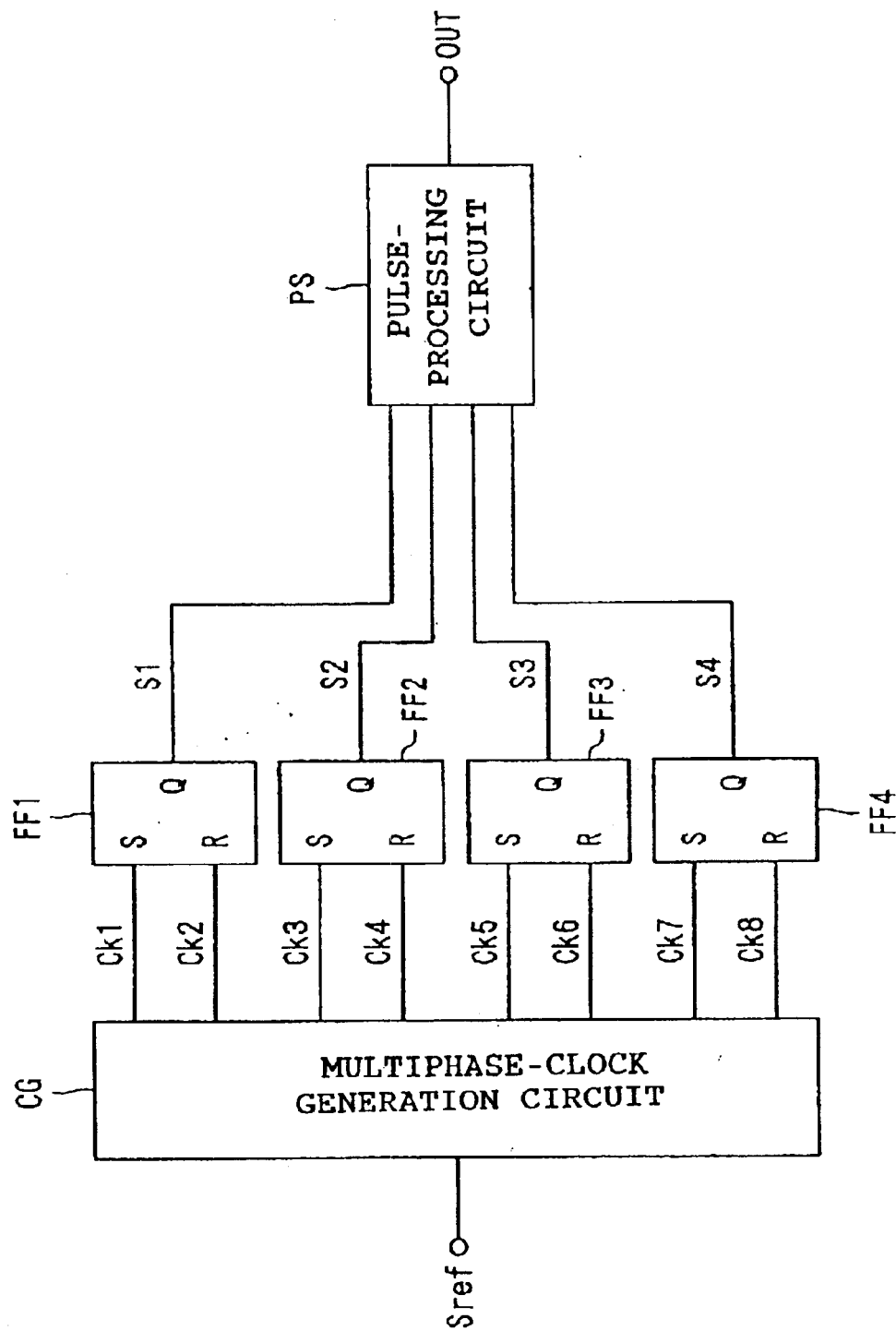

[FIG. 12]
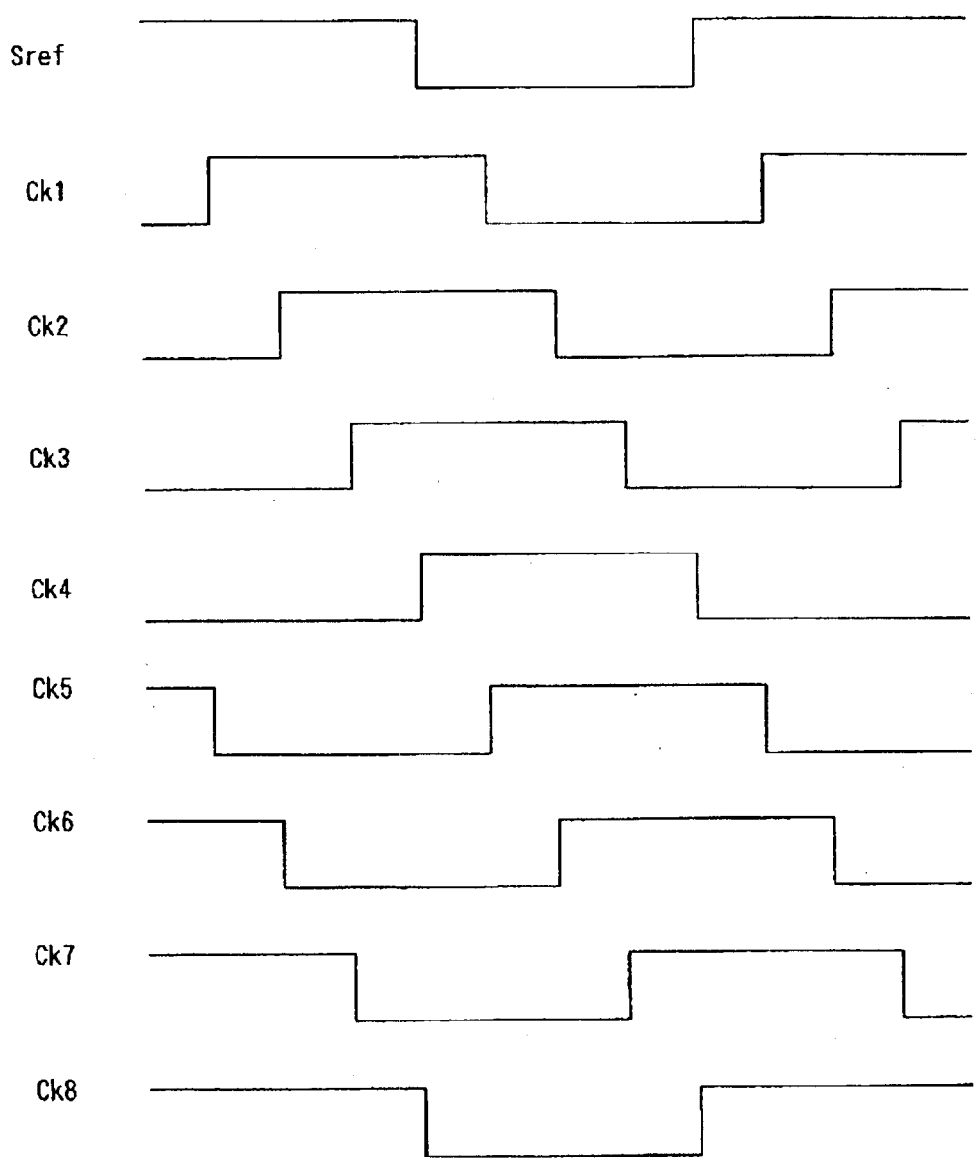

[FIG. 13]
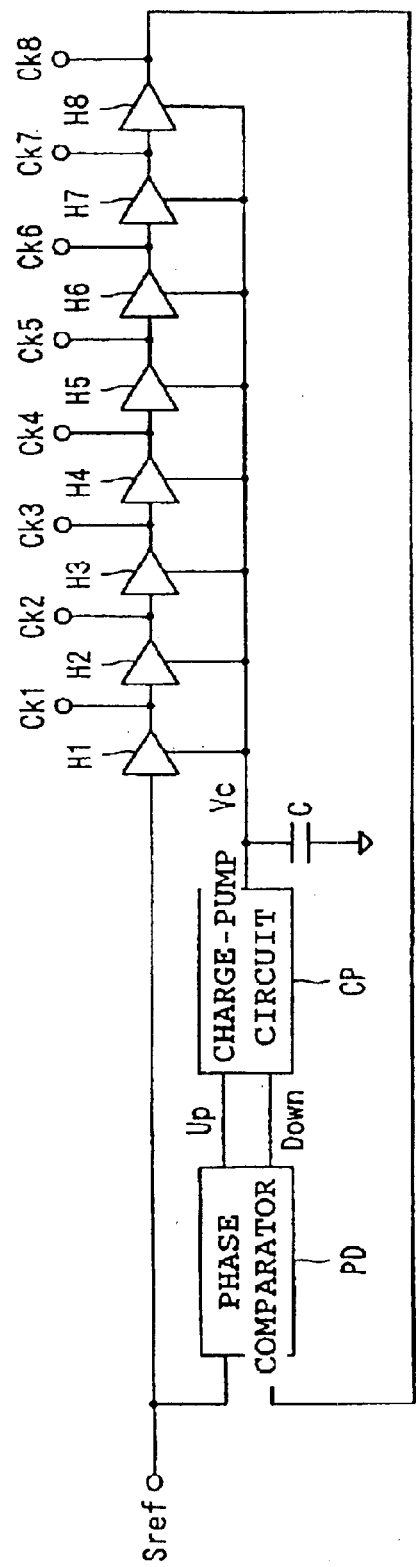

[FIG. 14]
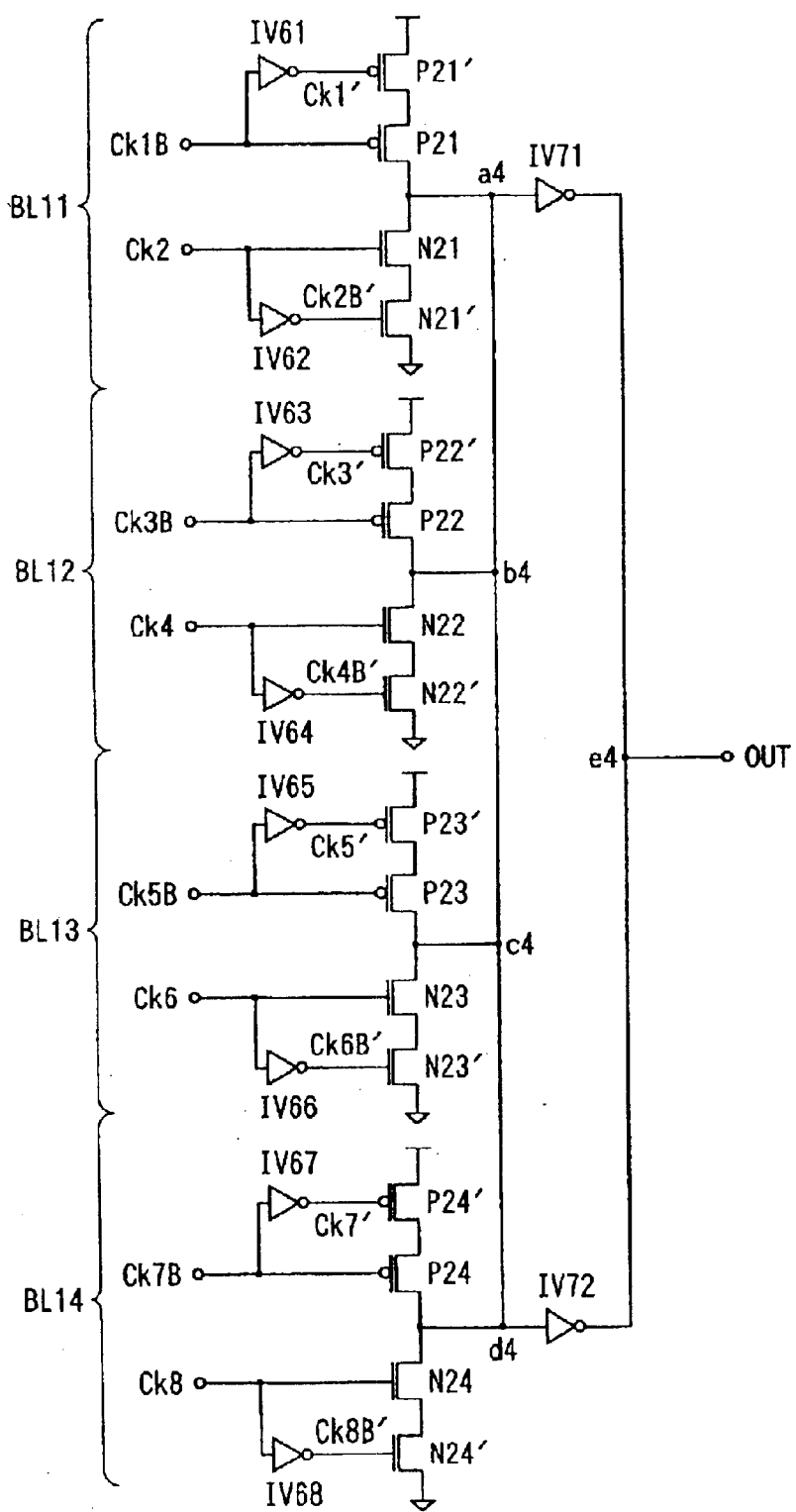

[FIG. 15]
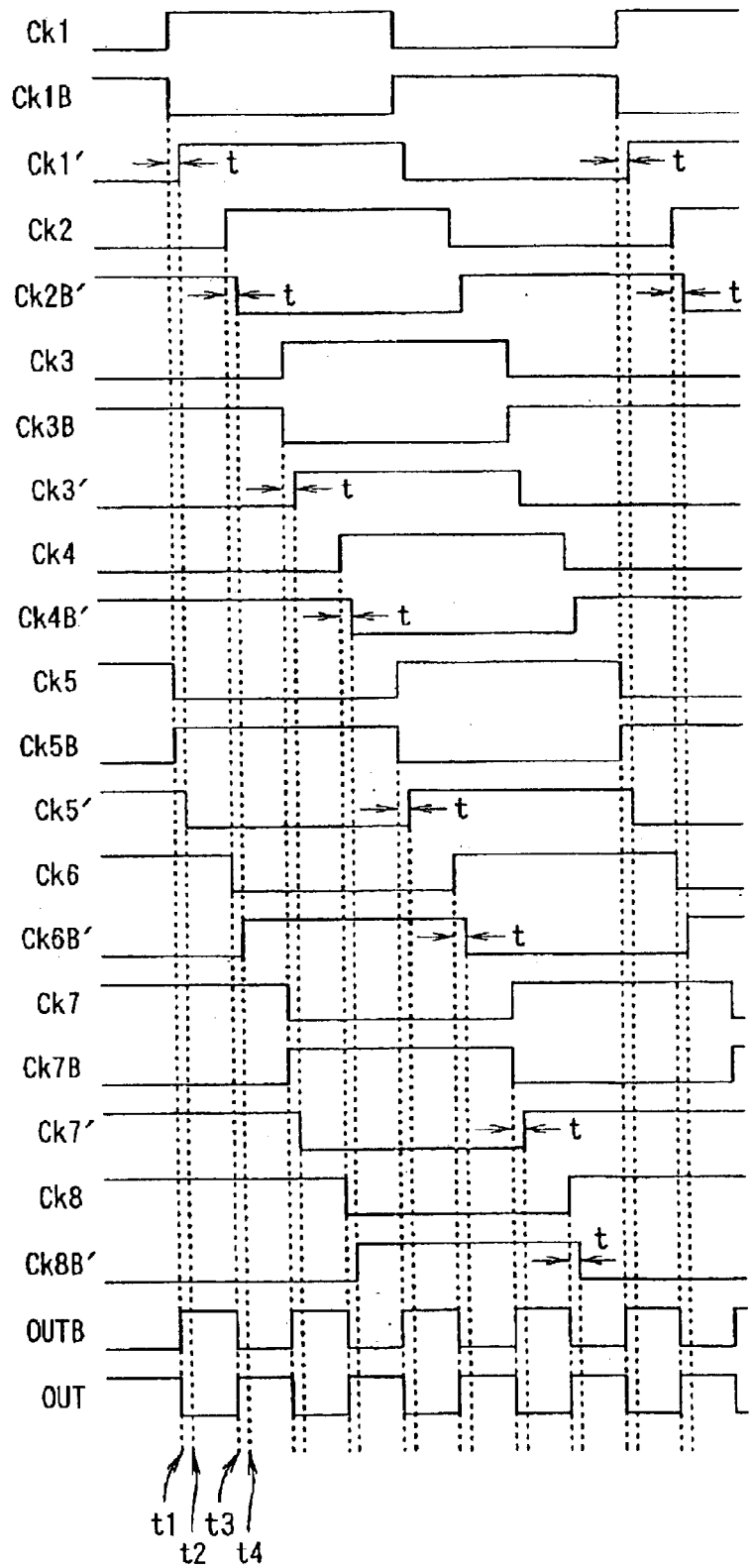

(FIG. 16)
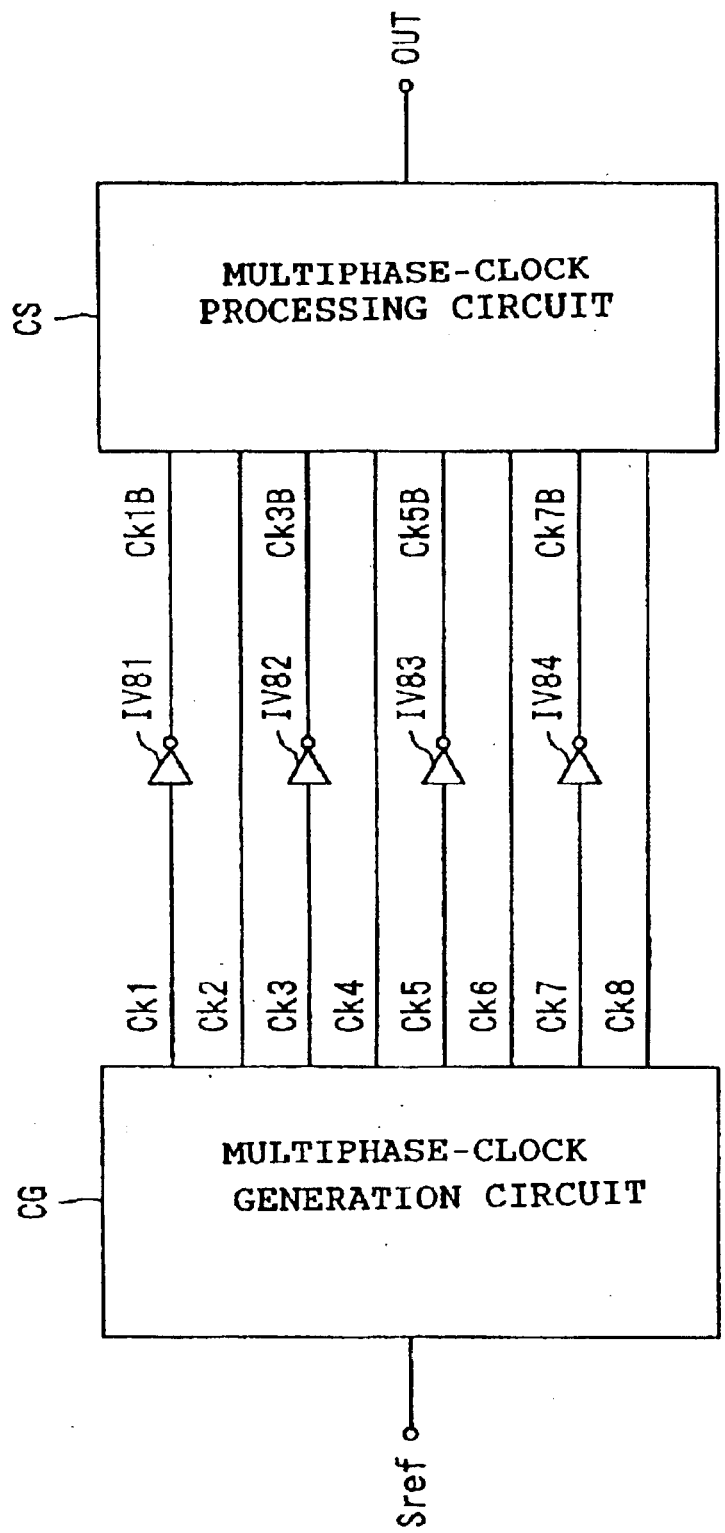

OUTPUT CIRCUIT, INPUT CIRCUIT, ELECTRONIC CIRCUIT, MULTIPLEXER, DEMULTIPLEXER, WIRED-OR CIRCUIT, WIRED-AND CIRCUIT, PULSE-PROCESSING CIRCUIT, MULTIPHASE-CLOCK PROCESSING CIRCUIT, AND CLOCK-MULTIPLIER CIRCUIT

TECHNICAL FIELD

The present invention relates to an output circuit, an input circuit, an electronic circuit, a multiplexer, a demultiplexer, a wired-OR circuit, a wired-AND circuit, a pulse-processing circuit, a multiphase-clock processing circuit, and a clock-multiplier circuit, and more specifically, the invention relates to reducing differences in the propagation delay time of signal paths in such circuits.

BACKGROUND

In recent LSI processes, miniaturization has progressed, thus the wiring width of LSI has been reduced and LSI speed has also progressed.

Accordingly, the impact of a wiring line on propagation delay has become significant. Therefore, in a conventional LSI, in order to reduce the differences in the propagation delay time, circuit layout designs are carried out so as to have the same signal path lengths as much as possible.

FIG. 17 is a circuit diagram showing the structure of a conventional 4-input multiplexer.

In FIG. 17, each of the transmission gates TG21 to TG28 has an input terminal, an output terminal, a selection-signal input terminal, and an inverted-signal input terminal, individually.

The transmission gates TG21 and TG22 are connected in cascade, the transmission gates TG23 and TG24 are connected in cascade, the transmission gates TG25 and TG26 are connected in cascade, and the transmission gates TG27 and TG28 are connected in cascade.

An input signal A enters the transmission gate TG21, an input signal B enters the transmission gate TG23, an input signal C enters the transmission gate TG25, an input signal D enters the transmission gate TG27, and the output terminals of the transmission gates TG22, TG24, TG26, and TG28 are commonly connected, and an output signal OUT is output therefrom.

Also, a selection input signal S1 enters the selection-signal input terminal of the transmission gate TG21, an inverted signal S1B of the selection input signal S1 enters the inverted-signal input terminal of the transmission gate TG21; a selection input signal S2 enters the selection-signal input terminal of the transmission gate TG22, an inverted signal S2B of the selection input signal S2 enters the inverted-signal input terminal of the transmission gate TG22; the selection input signal S1 enters the selection-signal input terminal of the transmission gate TG23, the inverted signal S1B of the selection input signal S1 enters the inverted-signal input terminal of the transmission gate TG23; the inverted signal S2B of a selection input signal S2 enters the selection-signal input terminal of the transmission gate TG24, the selection input signal S2 enters the inverted-signal input terminal of the transmission gate TG24; the inverted signal S1B of the selection input signal S1 enters the selection-signal input terminal of the transmission gate TG25, the selection input signal S1 enters the inverted-signal input terminal of the transmission gate TG25; the selection input signal S2 enters the selection-signal input terminal of the transmission gate TG26, the inverted signal S2B of the selection input signal S2 enters the inverted-signal input terminal of the transmission gate TG26; the inverted signal S1B of the selection input signal S1 enters the selection-signal input terminal of the transmission gate TG27, the selection input signal S1 enters the inverted-signal input terminal of the transmission gate TG27; the inverted signal S2B of the selection input signal S2 enters the selection-signal input terminal of the transmission gate TG28, and the selection input signal S2 enters the inverted-signal input terminal of the transmission gate TG28.

Then, when a 2-bit selection input signal (S1, S2)=(1, 1), the transmission gates TG21 and TG22 turn on to output the input signal A as the output signal OUT; when a 2-bit selection input signal (S1, S2)=(1, 0), the transmission gates TG23 and TG24 turn on to output the input signal B as the output signal OUT; when a 2-bit selection input signal (S1, S2)=(0, 1), the transmission gates TG25 and TG26 turn on to output the input signal C as the output signal OUT; and when a 2-bit selection input signal (S1, S2)=(0, 0), the transmission gates TG27 and TG28 turn on to output the input signal D as the output signal OUT.

FIG. 18 is a circuit diagram showing the structure of a conventional 4-output demultiplexer.

In FIG. 18, each of the transmission gates TG31 to TG38 has an input terminal, an output terminal, a selection-signal input terminal, and an inverted-signal input terminal, individually.

The transmission gates TG31 and TG32 are connected in cascade, the transmission gates TG33 and TG34 are connected in cascade, the transmission gates TG35 and TG36 are connected in cascade, and the transmission gates TG37 and TG38 are connected in cascade.

Also, the input terminals of the transmission gates TG31, TG33, TG35, and TG37 are commonly connected, an input signal IN enters the input terminals of the transmission gates TG31, TG33, TG35, and TG37, at the same time, the transmission gate TG32 outputs an output signal A, the transmission gate TG34 outputs an output signal B, the transmission gate TG36 outputs an output signal C, and the transmission gate TG38 outputs an output signal D.

Also, a selection input signal S1 enters the selection-signal input terminal of the transmission gate TG31, an inverted signal S1B of the selection input signal S1 enters the inverted-signal input terminal of the transmission gate TG31; a selection input signal S2 enters the selection-signal input terminal of the transmission gate TG32, an inverted signal S2B of the selection input signal S2 enters the inverted-signal input terminal of the transmission gate TG32; the selection input signal S1 enters the selection-signal input terminal of the transmission gate TG33, the inverted signal S1B of the selection input signal S1 enters the inverted-signal input terminal of the transmission gate TG33; the inverted signal S2B of the selection input signal S2 enters the selection-signal input terminal of the transmission gate TG34, the selection input signal S2 enters the inverted-signal input terminal of the transmission gate TG24; the inverted signal S1B of the selection input signal S1 enters the selection-signal input terminal of the transmission gate TG35, the selection input signal S1 enters the inverted-signal input terminal of the transmission gate TG35; the selection input signal S2 enters the selection-signal input terminal of the transmission gate TG36, an inverted signal S2B of the selection input signal S2 enters the inverted-signal input terminal of the transmission gate TG36; the inverted signal S1B of the selection input signal S1 enters the selection-signal input terminal of the transmission gate TG37, the selection input signal S1 enters the inverted-signal input terminal of the transmission gate TG37; the inverted signal S2B of the selection input signal S2 enters the selection-signal input terminal of the transmission gate TG38, and the selection input signal S2 enters the inverted-signal input terminal of the transmission gate TG38.

Then when a 2-bit selection input signal (S1, S2)=(1, 1), the transmission gates TG31 and TG32 turn on to output the input signal IN as the output signal A; when a 2-bit selection input signal (S1, S2)=(1, 0), the transmission gates TG33 and TG34 turn on to output the input signal IN as the output signal B; when a 2-bit selection input signal (S1, S2)=(0, 1), the transmission gates TG35 and TG36 turn on to output the input signal IN as the output signal C; and when a 2-bit selection input signal (S1, S2)=(0, 0), the transmission gates TG37 and TG38 turn on to output the input signal IN as the output signal D.

However, in the multiplexer shown in FIG. 17, when disposing the transmission gates TG21 to TG28 on a silicon substrate, and taking out the output signal OUT at the middle of the output nodes of the transmission gates TG22, TG24, TG26 and TG28, a wiring length of taking out the input signals A and D as the output signal OUT becomes longer as compared with a wiring length of taking out the input signals B and C as the output signal OUT.

Consequently, the propagation delay of the input signals A and D becomes larger than that of the input signals B and C. Thus, there has been a problem in that every time the output signal OUT is switched by the selection input signal (S1, S2), jitters (fluctuations of edges) arise corresponding to the difference s in the propagation time of the input signals A to D.

If the circuit layout design is changed such that the wiring lengths become the same when taking out the input signals A to D as the output signal OUT, design work becomes bothersome. Moreover, when the number of input signals is large, the design change is not realistic.

Also, in the method of using a low resistance process such as copper wiring in order to reduce the propagation delay, there has been a problem in that the cost is increased, and if the difference in wiring length is too large, the difference in the propagation delay time cannot be eliminated.

Similarly, the same problems exist in the demultiplexer shown in FIG. 18.

Accordingly, one aspect of the present invention is to provide an output circuit, an input circuit, an electronic circuit, a multiplexer, a demultiplexer, a wired-OR circuit, a wired-AND circuit, a pulse-processing circuit, a multiphase-clock processing circuit, and a clock-multiplier circuit which are capable of having substantially the same propagation delay time for each signal path, without designing the circuit layout to have the same wiring length, and without using a low resistance process.

SUMMARY

In order to solve the above-described problem, according to a first aspect of the present invention, there is provided an output circuit including: distribution means for distributing an output signal into a plurality of paths; and synthesis means for synthesizing the distributed signals to output the signal.

With this arrangement, it is possible to obtain the output signal through a plurality of paths having different wiring lengths, thus the propagation delay time of the output signal can be averaged.

It is, therefore, possible to make the propagation delay time of each of signal path substantially the same without designing the circuit layout to have the same length of wiring for deriving the output signal, or without using a low resistance process. Thus, design workload can be reduced, and at the same time, manufacturing costs can be lowered.

Also, according to a second aspect of the present invention, there is provided an output circuit including: an array of signal output terminals disposed at uniform intervals relative to one another; a first connection line which connects adjacent signal output terminals with each other; a second connection line which connects the signal output terminals at both ends of the array; and a common output terminal disposed at the middle point of the second connection line.

With this arrangement, even when a plurality of signal output terminals are provided, it becomes possible to make average values of the distance from each of the signal output terminals to the common output terminal identical.

Therefore, only by adding a simple structure to the signal output terminals, it becomes possible to make the propagation delay time of each signal path substantially the same, and thus, design workload can be reduced. At the same time, using a low resistance process becomes unnecessary in order to make the propagation delay time of each signal path substantially the same, and thus it becomes possible to lower manufacturing costs.

Also, in the output circuit according to the second aspect of the present invention, buffer circuits may be disposed on the second connection line in the vicinities of the signal output terminals at both ends.

With this arrangement, even when a plurality of signal output terminals are provided, it becomes possible to make average values of the distance from each of the signal output terminals to the common output terminals identical, and also, it becomes possible to further reduce the differences of the propagation delay time of each signal path extending from each signal output terminal to the common output terminal.

Also, according to a third aspect of the present invention, there is provided an input circuit including: distribution means for distributing an input signal to a plurality of paths; and synthesis means for synthesizing the distributed signals to input the signal.

With this arrangement, it becomes possible to obtain the input signal through a plurality of paths having different wiring lengths, and thus the propagation delay time of the input signal can be averaged.

It is, therefore, possible to make the propagation delay time of each signal path substantially the same without designing the circuit layout to have the same length of wiring for obtaining the input signal, and without using a low resistance process. Thus, design workload can be reduced, and at the same time, manufacturing costs can be lowered.

Also, according to a fourth aspect of the present invention, there is provided an input circuit including: signal input terminals disposed at uniform intervals; a first connection line which connects adjacent signal input terminals with each other; a second connection line which connects signal input terminals; and a common input terminal disposed at the middle point of the second connection line.

With this arrangement, even when a plurality of signal input terminals are provided, it becomes possible to make average values of the distance from the common input terminal to each of the signal input terminals identical.

Therefore, only by adding a simple structure to the signal input terminals, it becomes possible to make the propagation delay time of each signal path substantially the same, and thus design workload can be reduced. At the same time, using a low resistance process becomes unnecessary in order to make the propagation delay time of each signal path substantially the same, and thus it becomes possible to lower manufacturing costs.

Also, in the input circuit according to the fourth aspect of the present invention, buffer circuits may be disposed on the second connection line in the vicinities of the signal input terminals.

With this arrangement, even when a plurality of signal input terminals are provided, it becomes possible to make average values of the distance from the common input terminal to each of the signal input terminals identical, and also, it becomes possible to further reduce the differences of the propagation delay time of each signal path extending from the common input terminal to each signal input terminal.

Also, according to a fifth aspect of the present invention, there is provided an electronic circuit including: a plurality of gate circuits having output terminals disposed at uniform intervals; distribution means for distributing each output signal from the gate circuit to a plurality of paths; and synthesis means for synthesizing the distributed signals to output the signal.

With this arrangement, it becomes possible to average the propagation delay time of the output signal without taking the circuit design into special consideration in order to make the length of the wiring for deriving the output signal from the gate circuits the same. Thus, in various electronic circuits including gate circuits, it becomes possible to make the propagation delay time of each signal path substantially the same, and to lower manufacturing costs, because adopting a low resistance process becomes unnecessary.

Also, according to a sixth aspect of the present invention, there is provided an electronic circuit including: a plurality of gate circuits having output terminals disposed at uniform intervals; a first connection line which connects adjacent signal output terminals of the gate circuits with each other; a second connection line which connects the output terminals of both ends of the plurality of gate circuits; and a common output terminal disposed at the middle point of the second connection line.

With this arrangement, in various electronic circuits including gate circuits, even when a plurality of signal output terminals are disposed, it becomes possible to make average values of the distance from each of the signal output terminals to the common output terminal identical only by adding a simple structure to the signal output terminals.

Therefore, it becomes possible to make the propagation delay time of each signal path substantially the same while keeping versatility for various electronic circuits. At the same time, using a low resistance process becomes unnecessary, and thus it becomes possible to lower manufacturing costs.

Also, in an electronic circuit according to the sixth aspect of the present invention, buffer circuits may be disposed on the second connection line in the vicinities of the signal output terminals.

With this arrangement, in various electronic circuits including gate circuits, it becomes possible to make average values of the distance from each of the signal output terminals to the common output terminal identical, and also, it becomes possible to further reduce the differences of the propagation delay time of each signal path extending from each signal output terminal to the common output terminal.

Also, according to a seventh aspect of the present invention, there is provided an electronic circuit including: a plurality of gate circuits having input terminals disposed at uniform intervals; distribution means for distributing an input signal to the gate circuits into a plurality of paths; and synthesis means for synthesizing the distributed signals to output the signal to the input terminals of the gate circuits.

With this arrangement, it becomes possible to average the propagation delay time of the input signal without taking the circuit design into special consideration in order to make the length of the wiring for delivering the input signal into gate circuits the same. Thus, in various electronic circuits including gate circuits, it becomes possible to make the propagation delay time of each signal path substantially the same, and to lower manufacturing costs, since adopting a low resistance process becomes unnecessary.

Also, according to an eighth aspect of the present invention, there is provided an electronic circuit including: a plurality of gate circuits having input terminals disposed at uniform intervals; a first connection line which connects adjacent signal input terminals of the gate circuits with each other; a second connection line which connects input terminals of both ends of the plurality gate circuits; and a common input terminal disposed at the middle point of the second connection line.

With this arrangement, in various electronic circuits including gate circuits, even when a plurality of signal input terminals are provided, it becomes possible to make average values of the distance from the common input terminal to each of the signal input terminals identical only by adding a simple structure to the signal input terminals.

Therefore, it becomes possible to make the propagation delay time of each signal path substantially the same while keeping versatility for various electronic circuits. At the same time, using a low resistance process becomes unnecessary, and thus it becomes possible to lower the manufacturing costs.

Also, in an electronic circuit according to the eighth aspect of the present invention, buffer circuits may be disposed on the second connection line in the vicinities of the signal input terminals.

With this arrangement, in various electronic circuits including gate circuits, it becomes possible to make average values of the distance from the common input terminal to each of the signal input terminals identical, and also, it becomes possible to further reduce the differences of the propagation delay time of each signal path extending from the common input terminal to each signal input terminal.

Also, according to a ninth aspect of the present invention, there is provided a multiplexer including: a plurality of transmission gates having output terminals disposed at uniform intervals; a first wiring line which connects adjacent output terminals of the transmission gates with each other by wires having a uniform length; buffer circuits disposed in the vicinities of each output terminal of both ends of the plurality of transmission gates; a second wiring line connecting the output terminals of both ends of the transmission gates through the buffer circuits; and a common output terminal disposed at the middle point of the second wiring line.

With this arrangement, in a multi-input multiplexer, it is possible to average the propagation delay time of the output signals which are output to a plurality of output terminals.

Therefore, it becomes possible to make the propagation delay time from each signal output terminal substantially the same, and thus design workload can be reduced. At the same time, using a low resistance process becomes unnecessary, and thus it becomes possible to lower manufacturing costs.

Also, according to a tenth aspect of the present invention, there is provided a demultiplexer including: a plurality of transmission gates having input terminals disposed at uniform intervals; a first wiring line which connects adjacent input terminals of the transmission gates with each other by wires having a uniform length; buffer circuits disposed in the vicinities of each input terminal of both ends of the plurality of transmission gates; a second wiring line connecting the input terminals of both ends of the plurality of transmission gates through the buffer circuits; and a common input terminal disposed in the middle point of the second wiring line.

With this arrangement, in a multi-output demultiplexer, it is possible to average the propagation delay time of the input signals which are input to a plurality of input terminals.

Therefore, it becomes possible to make the propagation delay time to each signal input terminal substantially the same, and thus design workload can be reduced. At the same time, using a low resistance process becomes unnecessary, and thus it becomes possible to lower manufacturing costs.

Also, according to an eleventh aspect of the present invention, there is provided a wired-OR circuit including: a plurality of CMOS transistor s which are connected between a high-level voltage and a low-level voltage, and have output terminals disposed at uniform intervals; a first wiring line which connects adjacent output terminals of the CMOS transistors with each other by wires having a uniform length; buffer circuits disposed in the vicinities of each output terminal of both ends of the plurality of CMOS transistors; a second wiring line connecting output terminals of both ends of the plurality of CMOS transistors through the buffer circuits; a common output terminal disposed at the middle point of the second wiring line; a third wiring line which connects each gate of the P-channel MOS transistors constituting the CMOS transistor to the low-level voltage; and input terminals disposed at uniform intervals corresponding to each gate of the N-channel MOS transistors constituting the CMOS transistors.

With this arrangement, in a wired-OR circuit, it is possible to average the propagation delay time of the output signals.

Therefore, it becomes possible to make the propagation delay time from each signal output terminal substantially the same, and thus design workload can be reduced. At the same time, using a low resistance process becomes unnecessary, and thus it becomes possible to lower manufacturing costs.

Also, according to a twelfth aspect of the present invention, there is provided a wired-AND circuit including: a plurality of CMOS transistors which are connected between a high-level voltage and a low-level voltage, and have output terminals disposed at uniform intervals; a first wiring line which connects adjacent output terminals of the CMOS transistors with each other by wires having a uniform length; buffer circuits disposed in the vicinities of each output terminal of both ends of the plurality of CMOS transistors; a second wiring line connecting output terminals of both ends of the plurality of CMOS transistors through the buffer circuits; a common output terminal disposed at the middle point of the second wiring line; a third wiring line which connects each gate of the N-channel MOS transistors constituting the CMOS transistors to the high-level voltage; and input terminals disposed at uniform intervals corresponding to each gate of the P-channel MOS transistors constituting the CMOS transistor.

With this arrangement, in a wired-AND circuit, it is possible to average the propagation delay time of the output signals.

Therefore, it becomes possible to make the propagation delay time from each signal output terminal substantially the same, and thus design workload can be reduced. At the same time, using a low resistance process becomes unnecessary, and thus it becomes possible to lower manufacturing costs.

Also, according to a thirteenth aspect of the present invention, there is provided a pulse-processing circuit which changes an output to a high level or a low level in synchronization with input rising edges or input falling edges and then keeps the output at a floating state, the circuit including: a plurality of gate circuits having output terminals disposed at uniform intervals; a first wiring line connecting adjacent output terminals of the gate circuits with each other by wires having a uniform length; buffer circuits disposed in the vicinities of each of the output terminals of both ends of the plurality of gate circuits; a second wiring line connecting the output terminals of both ends of the plurality of gate circuits through the buffer circuits; and a common output terminal disposed at the middle point of the second wiring line.

With this arrangement, in a pulse-processing circuit which can change an output level in synchronization with the level change of any input level of a plurality of inputs, it is possible to average the propagation delay time of the output signals.

Therefore, it becomes possible to make the propagation delay time from each signal output terminal substantially the same, and thus design workload can be reduced. At the same time, using a low resistance process becomes unnecessary, and thus it becomes possible to lower manufacturing costs.

Also, in a pulse-processing circuit according to the thirteenth aspect of the present invention, the gate circuit may include: a charge-storage part disposed at the output terminal; a switching element which supplies charge to the charge-storage part in synchronization with input rising edges or input falling edges; and blocking means which blocks the switching element from the charge-storage part after a predetermined delay time has passed from the input rising edge or the input falling edge.

With this arrangement, it becomes possible to average the propagation delay time of the output signals, and make the output terminal in a floating state after changing an output level in synchronization with an input level change. Thus, when a plurality of output terminals are commonly connected, it is possible to make the output level follow an input level change of any of the gate circuits.

Also, in a pulse-processing circuit according to the thirteenth aspect of the present invention, the gate circuit includes: first and second P-channel field-effect transistors connected in series between a high level voltage and an output terminal; and first and second N-channel field-effect transistors connected in series between the output terminal and a low level voltage, each gate of the first P-channel field-effect transistor and the first N-channel field-effect transistor is connected to an input terminal, each gate of the second P-channel field-effect transistor and the second N-channel field-effect transistor is connected to the input terminal through an inverter.

With this arrangement, by connecting four transistors in series between the high level voltage and the low level voltage, it becomes possible to change an output level in response to an input level change, and then keep the output terminal in a floating state.

Also, by connecting four transistor in series, even when an input level changes, it becomes possible to prevent a penetrating current to flow between a high-level voltage and a low-level voltage, and thus lowering power consumption can be possible.

Also, according to a fourteenth aspect of the present invention, there is provided a multiphase-clock processing circuit which changes an output level in synchronization with input rising edges or input falling edges of a multiphase-clock and then keeps the output at a floating state, the circuit including: a plurality of gate circuits having output terminals disposed at uniform intervals; a first wiring line connecting adjacent output terminals of the gate circuits with each other by wires having a uniform length; buffer circuits disposed in the vicinities of each of the output terminals of both ends of the plurality of gate circuits; a second wiring line connecting the output terminals of both ends of the gate circuits through the buffer circuits; and a common output terminal disposed at the middle point of the second wiring line.

With this arrangement, in a multiphase-clock processing circuit which generates pulse signals using rising edges or falling edges of a multiphase-clock, it becomes possible to average the propagation delay time of the output signals.

Therefore, it becomes possible to make the propagation delay time from each signal output terminal substantially the same, and thus design workload can be reduced. At the same time, using a low resistance process becomes unnecessary, and thus it becomes possible to lower manufacturing costs.

Also, in a multiphase-clock processing circuit according to the fourteenth aspect of the present invention, the gate circuit may include: a charge-storage part disposed at the output terminal; a first switching element which connects the output terminal to a high level voltage for a predetermined time period in synchronization with either input rising edges or input failing edges of a multiphase-clock; and a second switching element which connects the output terminal to a low level voltage for a predetermined time period in synchronization with either input rising edges or input falling edges of another multiphase-clock.

With this arrangement, it becomes possible to average the propagation delay time of the output signals. At the same time, it becomes possible to generate pulse signals based on rising edges or falling edges of a multiphase-clock, and to keep the output level of the pulse signal in a floating state without change.

Also, in a multiphase-clock processing circuit according to the fourteenth aspect of the present invention, the predetermined time period may be shorter than a phase shift amount of a multiphase-clock.

With this arrangement, even when a plurality of the first switching elements or the second switching elements are respectively connected in parallel, it becomes possible to keep only one of each switching element in a conductive state, and to keep the remaining switching elements in a floating state. Thus it is possible to prevent a plurality of switching elements from going into a conductive state at the same time, and to prevent output levels of a plurality of switching elements from interfering with each other.

Also, in a multiphase-clock processing circuit according to the fourteenth aspect of the present invention, a plurality of the first switching elements and a plurality of the second switching elements are connected in parallel and disposed at uniform intervals; and the first switching element and the second switching element are alternately brought into conduction in synchronization with rising edges or falling edges of each phase of the multiphase-clock.

With this arrangement, it becomes possible to alternately switch the output level of the output terminal between a high-level and a low-level every time each phase of the multiphase-clock rises or falls. Thus, it becomes possible to generate a multiplied clock having an N times frequency of the multiphase-clock.

Furthermore, it becomes possible to define the duty ratio of the multiplied clock based on only either the input timing of rising edges or falling edges. Even when the duty ratio of a multiphase-clock deviates, by aligning either one of the input timing of a rising edge or a falling edge, it becomes possible to align the duty ratio of the multiplied clock.

Also, in a multiphase-clock processing circuit according to a fifteenth aspect of the present invention, an N number of the first switching elements and an N number of the second switching elements may be connected in parallel, the nth (n=1 to N) first switching element is brought into conduction in synchronization with rising edges or falling edges of the (2n−1) phase of 2N phases of multiphase-clock, and the nth (n=1 to N) second switching element may be brought into conduction in synchronization with rising edges or falling edges of the (2n) phases of 2N phases of multiphase-clock.

With this arrangement, it becomes possible to generate a multiplied clock having an N times frequency of the multiphase-clock only by connecting an N number of the first switching elements and an N number of the second switching elements.

Also, in a multiphase-clock processing circuit according to the fifteenth aspect of the present invention, the first switching element may include: first and second P-channel field-effect transistors connected in series between a high level voltage and an output terminal; and a first inverter for delaying an inversion signal of either multiphase-clock inputted to a gate terminal of either one of the first and second P-channel field-effect transistors by the predetermined time period and outputting the signal to a gate terminal of the other P-channel field-effect transistor, the second switching element includes: first and second N-channel field-effect transistors connected in series between a low-level voltage and an output terminal; and a second inverter for delaying either multiphase-clock inputted to a gate terminal of either one of the first and second N-channel field-effect transistors by the predetermined time period and outputting the multiphase-clock to a gate terminal of the other N-channel field-effect transistor.

With this arrangement, by connecting four transistors in series, it becomes possible to alternately switch the output level of the output terminal between a high-level and a low-level every time each phase of the multiphase-clock rises or falls, and then make the output level be in a floating state.

Also, according to a sixteenth aspect of the present invention, there is provided a clock-multiplier circuit including: a multiphase-clock generation circuit for generating a multiphase-clock; a pulse-generation circuit for generating non-overlap pulses based on the multiphase-clock; and a pulse-processing circuit for outputting a logical sum of the non-overlap pulses, wherein the pulse-processing circuit includes; a plurality of gate circuits which change an output to a high level or a low level in synchronization with input rising edges or input falling edges, then keep the output in a floating state, and have output terminals disposed at uniform intervals; a first wiring line which connects adjacent output terminals of the gate circuits with each other by wires having a uniform length; buffer circuits disposed in the vicinities of each output terminal of both ends of the plurality of gate circuits; a second wiring line which connects the output terminals of both ends of the plurality of gate circuits with each other through the buffer circuits; and a common output terminal disposed at the middle point of the second wiring line.

With this arrangement, it becomes possible to maintain an input symmetric structure, and to average the propagation delay time of the output signals irrespective of the number of inputs of non-overlap pulses. Thus it becomes possible to restrain an increase of jitter, and to prevent deterioration of clock quality, and to reduce power consumption and cost.

Also, according to a seventeenth aspect of the present invention, there is provided a clock-multiplier circuit including: a multiphase-clock generator circuit for generating a multiphase clock; and a multiphase-clock processing circuit for directly generating a multiplied clock from the multiphase-clock, wherein the multiphase-clock processing circuit includes; a plurality of gate circuits which switch an output level in synchronization with rising edges or falling edges of the multiphase-clock, then keep the output level in a floating state, and have output terminals disposed at uniform intervals; a first wiring line which connects adjacent output terminals of the gate circuits with each other by wires having a uniform length; buffer circuits disposed in the vicinities of each output terminal of both ends of the plurality of gate circuits; a second wiring line which connects the output terminals of both ends of the plurality of gate circuits with each other through the buffer circuits; and a common output terminal disposed at the middle point of the second wiring line.

With this arrangement, it becomes unnecessary to generate a non-overlap pulse in order to generate a multiplied clock from a multiphase-clock. Also, since RS flip-flops become unnecessary, it is possible to average the propagation delay time of the output signals, and to make the propagation delay time substantially the same.

Consequently, it becomes possible to utilize a miniaturization process easily, prevent an increase in circuit size, and restrain an increase of chip area and power consumption. Also, jitter can be restrained and higher clock frequency can be achieved.

Also, in the clock-multiplier circuit according to the seventeenth aspect of the present invention, the multiphase-clock generation circuit may be a PLL circuit or a DLL circuit.

Here, by using a PLL circuit or a DLL circuit, a multiphase-clock can be easily generated.

Particularly, by using a PLL circuit, a multiphase-clock having a uniform phase shift can be easily generated.

On the other hand, by using a DLL circuit, a clock having an N times frequency can be generated without using an oscillator, and thus it becomes possible to prevent the generation of low-frequency noises inherent to oscillators.

BRIEF DESCRIPTION OF THE DRAWINGS

FIG. 1 is a circuit diagram illustrating the structure of a 4-input multiplexer according to a first embodiment of the present invention.

FIG. 2 is a diagram illustrating the distances of the signal paths of a 4-input multiplexer according to a first embodiment of the present invention.

FIG. 3 is a diagram illustrating the distances of the signal paths of a 4-input multiplexer according to a second embodiment of the present invention.

FIG. 4 is a diagram illustrating the wiring resistance of a 4-input multiplexer according to a third embodiment of the present invention.

FIG. 5($a$) is a diagram showing the calculation result of the distances of the signal paths of the 4-input multiplexer in FIG. 2, FIG. 5($b$) is a diagram showing the calculation result of the distances of the signal paths of the 4-input multiplexer in FIG. 3, and FIG. 5($c$) is a diagram showing the calculation result of the wiring resistance of the 4-input multiplexer in FIG. 4.

FIG. 6 is a circuit diagram illustrating the structure of a 4-output demultiplexer according to a fourth embodiment of the present invention.

FIG. 7 is a circuit diagram illustrating the structure of a 4-input wired-OR circuit according to a fifth embodiment of the present invention.

FIG. 8 is a circuit diagram illustrating the structure of a 4-input wired-AND circuit according to a sixth embodiment of the present invention.

FIG. 9 is a circuit diagram illustrating the structure of a 4-input pulse-processing circuit according to a seventh embodiment of the present invention.

FIG. 10 is a timing chart illustrating the operation of a 4-input pulse-processing circuit according to a seventh embodiment of the present invention.

FIG. 11 is a block diagram illustrating the structure of a clock-multiplier circuit according to an eighth embodiment of the present invention.

FIG. 12 is a diagram illustrating an example of the multiphase-lock output from the multiphase-clock generation circuit in FIG. 11.

FIG. 13 is a block diagram illustrating the structure of the multiphase-clock generation circuit used for the clock multiplier circuit in FIG. 11.

FIG. 14 is a circuit diagram illustrating the structure of a multiphase-clock processing circuit according to a ninth embodiment of the present invention.

FIG. 15 is a timing chart illustrating the operation of the multiphase-clock processing circuit according to the ninth embodiment of the present invention.

FIG. 16 is a block diagram illustrating the structure of the clock-multiplier circuit according to a tenth embodiment of the present invention.

DETAILED DESCRIPTION

Figure 17:
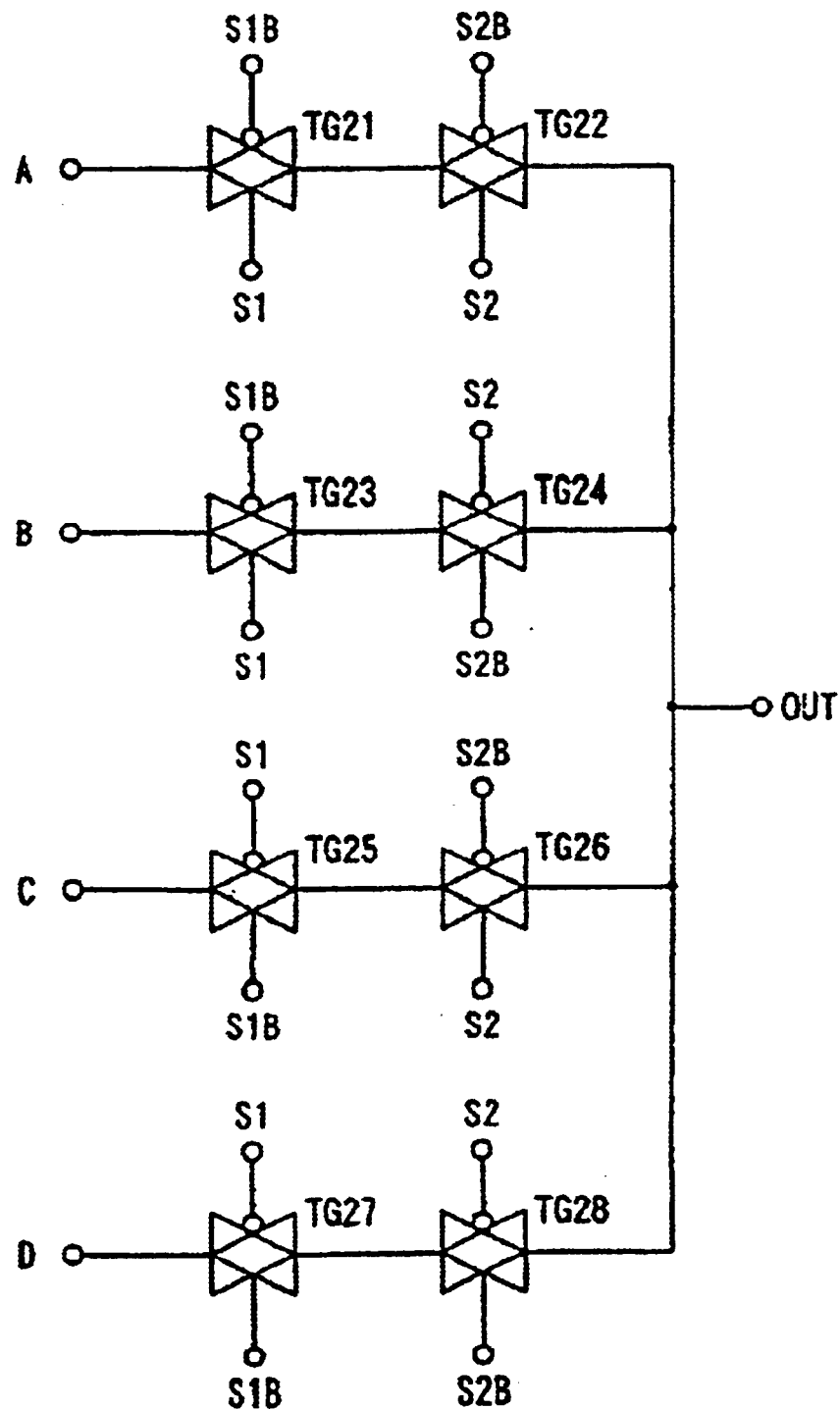
FIG. 17 is a circuit diagram illustrating a conventional 4-input multiplexer.
Figure 18:
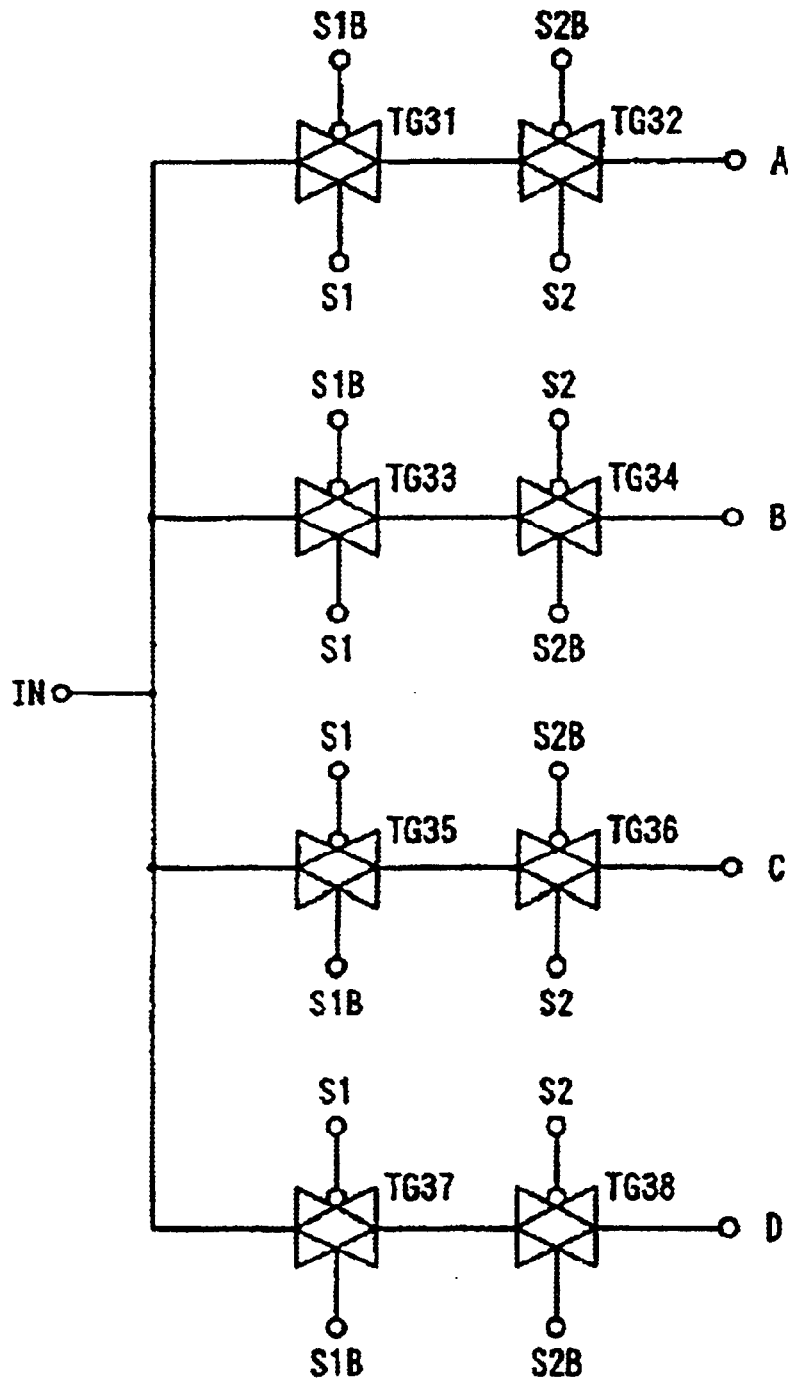
FIG. 18 is a circuit diagram illustrating a conventional 4-output demultiplexer.

In the following, a description will be given for application examples of the output circuit, the input circuit, the multiplexer, the demultiplexer, the wired-OR circuit, the wired-AND circuit, the pulse-processing circuit, the multiphase-clock processing circuit, and the clock-multiplier circuit according to embodiments of the present invention with reference to the drawings.

FIG. 1 is a circuit diagram illustrating the structure of a 4-input multiplexer according to a first embodiment of the present invention.

In FIG. 1, each of the transmission gates TG1 to TG8 has an input terminal, an output terminal, a selection-signal input terminal, and an inverted-signal input terminal individually.

The transmission gates TG1, TG3, TG5, and TG7 are disposed at uniform intervals, and the transmission gates TG2, TG4, TG6, and TG8 are disposed at uniform intervals. The distance between the transmission gates TG1 and TG2, the distance between the transmission gates TG3 and TG4, the distance between the transmission gates TG5 and TG6, and the distance between the transmission gates TG7 and TG8 are equal to each other.

The transmission gates TG1 and TG2 are connected in cascade, the transmission gates TG3 and TG4 are connected in cascade, the transmission gates TG5 and TG6 are connected in cascade, and the transmission gates TG7 and TG8 are connected in cascade.

Also, an input signal A enters the transmission gate TG1, an input signal B enters the transmission gate TG3, an input signal C enters the transmission gate TG5, and an input signal D enters the transmission gate TG7.

Further, output nodes a to d are disposed at the output side of the transmission gates TG2, TG4, TG6, and TG8, respectively, and these nodes a to d are connected in such a way that the wiring lengths between adjacent nodes are the same.

Also, the output nodes a and d at both ends are provided with an inverter IV11 and an inverter IV12, respectively, each output of IV11 and IV12 is connected to a common node e, and an output signal OUT is output from the common node e through an inverter IV13.

The common node e is disposed at the position where the wiring length from each of the inverters IV11 and IV12 is the same.

Also, a selection input signal S1 enters the selection-signal input terminal of the transmission gate TG1, an inverted signal S1B of the selection input signal S1 enters the inverted-signal input terminal of the transmission gate TG1; a selection input signal S2 enters the selection-signal input terminal of the transmission gate TG2, an inverted signal S2B of the selection input signal S2 enters the inverted-signal input terminal of the transmission gate TG2; the selection input signal S1 enters the selection-signal input terminal of the transmission gate TG3, the inverted signal S1B of the selection input signal S1 enters the inverted-signal input terminal of the transmission gate TG3; the inverted signal S2B of the selection input signal S2 enters the selection-signal input terminal of the transmission gate TG4, the selection input signal S2 enters the inverted-signal input terminal of the transmission gate TG4; the inverted signal S1B of the selection input signal S1 enters the selection-signal input terminal of the transmission gate TG5, the selection input signal S1 enters the inverted-signal input terminal of the transmission gate TG5; the selection input signal S2 enters the selection-signal input terminal of the transmission gate TG6, the inverted signal S2B of the selection input signal S2 enters the inverted-signal input terminal of the transmission gate TG6; the inverted signal S1B of the selection input signal S1 enters the selection-signal input terminal of the transmission gate TG7, the selection input signal S1 enters the inverted-signal input terminal of the transmission gate TG7; the inverted signal S2B of the selection input signal S2 enters the selection-signal input terminal of the transmission gate TG8, and the selection input signal S2 enters the inverted-signal input terminal of the transmission gate TG8.

Then, when a 2-bit selection input signal (S1, S2) (1, 1), the transmission gates TG1 and TG2 turn on to output the input signal A as the output signal OUT; when a 2-bit selection input signal (S1, S2)=(1, 0), the transmission gates TG3 and TG4 turn on to output the input signal B as the output signal OUT; when a 2-bit selection input signal (S1, S2)=(0, 1), the transmission gates TG5 and TG6 turn on to output the input signal C as the output signal OUT; and when a 2-bit selection input signal (S1, S2)=(0, 0), the transmission gates TG7 and TG8 turn on to output the input signal D as the output signal OUT.

When the input signal A is output as the output signal OUT, a signal sent from the output node a to the common node e is divided into two paths, a first path: the output node a→the inverter IV11→the common node e, and a second path: the output node a→the output node b→the output node c→the output node d→the inverter IV12→the common node e.

Then the input signal A which has passed through these two paths is synthesized at the common node e, and is output as the output signal OUT through the inverter IV13.

Also, when the input signal B is output as the output signal OUT, a signal sent from the output node b to the common node e is divided into two paths, a first path: the output node b→the output node a→the inverter IV11→the common node e, and a second path: the output node b→the output node c→the output node d→the inverter IV12→the common node e.

Then the input signal B which has passed through these two paths is synthesized at the common node e, and is output as the output signal OUT through the inverter IV13.

Also, when the input signal C is output as the output signal OUT, a signal sent from the output node c to the common node e is divided into two paths, a first path: the output node c→the output node b→the output node a→the inverter IV11→the common node e, and a second path: the output node c→the output node d→the inverter IV12→the common node e.

Then the input signal C which has passed through these two paths is synthesized at the common node e, and is output as the output signal OUT through the inverter IV13.

Also, when the input signal D is output as the output signal OUT, a signal sent from the output node d to the common node e is divided into two paths, a first path: the output node d→the output node c→the output node b→the output node a→the inverter IV11→the common node e, and a second path: the output node d→the inverter IV12→the common node e.

Then the input signal D which has passed through these two paths is synthesized at the common node e, and is output as the output signal OUT through the inverter IV13.

FIG. 2 is a diagram illustrating the distances of the signal paths of a 4-input multiplexer according to a first embodiment of the present invention. FIG. 5(a) is a diagram showing the calculation result of the distances of the signal paths of a 4-input multiplexer in FIG. 2.

In FIG. 2, the distance between the output node a and the output node b, the distance between the output node b and the output node c, and the distance between the output node c and the output node d are each assumed to be D.

When the output signal OUT is derived from each of the output nodes a to d, since a time constant of charge and discharge, which causes the difference in propagation delay, is directly proportional to a wiring resistance, and if a wire width is the same, the wiring resistance is directly proportional to the wiring length, the difference of the propagation delay is estimated by the difference of the wiring length.

Here, the distance from each of the inverters IV11 and IV12 to the inverter IV13 is the same, and thus the distance from each of the output nodes a to d to each of the inverters IV11 and IV12 are calculated in order to estimate the difference of the wiring length. The distance from the output node a to the inverter IV11 is 0D, and the distance from the output node a to the inverter IV12 is 3D.

Then the signal sent from the output node a is divided into the signal passing the inverter IV11 and the signal passing the inverter IV12, and then these signals are synthesized at the common node e to be output as the output signal OUT through the inverter IV13.

Consequently, the propagation delay of the signal sent from the output node a becomes the average of the propagation delay of the path passing the inverter IV11 and the propagation delay of the path passing the inverter IV12, and thus is equal to the propagation delay of passing the path having a distance of 1.5D.

Also, since the distance from the output node b to the inverter IV11 is 1D, and the distance from the output node b to the inverter IV12 is 2D, the propagation delay of the signal sent from the output node b, which has the average of these distances, becomes the same as the propagation delay of the path having a distance of 1.5D.

Also, since the distance from the output node c to the inverter IV11 is 2D, and the distance from the output node b to the inverter IV12 is 1D, the propagation delay of the signal sent from the output node c, which has the average of these distances, becomes the same as the propagation delay of the path having a distance of 1.5D.

Also, since the distance from the output node d to the inverter IV11 is 3D, and the distance from the output node b to the inverter IV12 is 0D, the propagation delay of the signal sent from the output node d, which has the average of these distances, becomes the same as the propagation delay of the path having a distance of 1.5D.

As a result, as shown in FIG. 5(a), when the output signal OUT is derived from any one of the output nodes a to d, the propagation delay can be the same as that of the path having a distance of 1.5D.

FIG. 3 is a diagram illustrating the distances of the signal paths of a 4-input multiplexer according to a second embodiment of the present invention. FIG. 5(b) is a diagram showing the calculation result of the distances of the signal paths of a 4-input multiplexer in FIG. 3.

In this regard, in the second embodiment, the positions of the inverters IV11 and IV12 are set corresponding to the positions of the output nodes b and c.

In FIG. 3, when setting the positions of the inverters IV11 and IV12 corresponding to the positions of the output nodes b and c, the signal sent from the output node a to the common node e is divided into two paths, a first path: the output node a→the output node b→the inverter IV11→the common node e, and a second path: the output node a→the output node b→the output node c→the inverter IV12→the common node e. The signals which have passed these two paths are synthesized at the common node e.

Also, the signal sent from the output node b to the common node e is divided into two paths, a first path: the output node b→the inverter IV11→the common node e, and a second path: the output node b→the output node c→the inverter IV12→the common node e. The signals which have passed these two paths are synthesized at the common node e.

Further, the signal sent from the output node c to the common node e is divided into two paths, a first path: the output node c→the output node b→the inverter IV11→the common node e, and a second path: the output node c→the inverter IV12→the common node e. The signals which have passed these two paths are synthesized at the common node e.

Furthermore, the signal sent from the output node d to the common node e is divided into two paths, a first path: the output node d→the output node c→the output node b→the inverter IV11→the common node e, and a second path: the output node d→the output node c→the inverter IV12→the common node e. The signals which have passed these two paths are synthesized at the common node e.

Consequently since the distance from the output node a to the inverter IV11 is 1D, and the distance from the output node a to the inverter IV12 is 2D, the propagation delay of the signal sent from the output node a, which has the average of these distances, becomes the same as the propagation delay of the path having a distance of 1.5D.

Also, since the distance from the output node b to the inverter IV11 is 0D, and the distance from the output node b to the inverter IV12 is 1D, the propagation delay of the signal sent from the output node b, which has the average of these distances, becomes the same as the propagation delay of the path having a distance of 0.5D.

Further, since the distance from the output node c to the inverter IV11 is 1D, and the distance from the output node c to the inverter IV12 is 0D, the propagation delay of the signal sent from the output node c, which has the average of these distances, becomes the same as the propagation delay of the path having a distance of 0.5D.

Furthermore, since the distance from the output node d to the inverter IV11 is 2D, and the distance from the output node a to the inverter IV12 is 1D, the propagation delay of the signal sent from the output node d, which has the average of these distances, becomes the same as the propagation delay of the path having a distance of 1.5D.

As a result, as shown in FIG. 5(b), when the positions of the inverters IV11 and IV12 are set corresponding to the positions of the output nodes b and c, the propagation delay at the time of deriving the output signal OUT from the output nodes a to d cannot be the same.

Consequently, the larger the distance from the output nodes a and d to the positions of the inverters IV11 and IV12, respectively, the larger the discrepancy of the propagation delay becomes. In order to make the propagation delay identical when deriving the output signal OUT from the output nodes a to d, it is preferable to dispose the inverters IV11 and IV12 respectively corresponding to the positions of the output nodes a to d of both ends.

FIG. 4 is a diagram illustrating the wiring resistance of a 4-input multiplexer according to a third embodiment of the present invention. FIG. 5(c) is a diagram showing the calculation result of the wiring resistance of a 4-input multiplexer in FIG. 4.

In this regard, in the third embodiment, the wiring in FIG. 1 is kept unchanged, the inverters IV11 and IV12 are removed, and an inverter IV14 for inverting the signal output from the inverter IV13 is disposed.

In FIG. 4, when the inverters IV11 and IV12 are removed from the structure in FIG. 1, suppose the distance between the output node a and the output node b, the distance between the output node a and the output node b, the distance between the output node b and the output node c, and the distance between the output node c and the output node d are each equal to D. At the same time, suppose the distance between the output node a and the output node e, and the distance between the output node d and the output node e are each equal to E.

Here, when removing the inverters IV11 and IV12 from the structure in FIG. 1, the signal sent from the output node a to the common node e is divided into two paths, a path I: the output node a→the common node e, and a second path II: the output node a→the output node b→the output node c→the output node d→the common node e. The signals which have passed these two paths I and II are synthesized at the common node e.

Also, the signal sent from the output node b to the common node e is divided into two paths, a path I: the output node b→the output node a—the common node e, and a path II: the output node b→the output node c→the output node d→the common node e. The signals which have passed these two paths I and II are synthesized at the common node e.

Further, the signal sent from the output node c to the common node e is divided into two paths, a path I: the output node c→the output node b→the output node a→the common node e, and a path II: the output node c→the output node d→the common node e. The signals which have passed these two paths I and II are synthesized at the common node e.

Furthermore, the signal sent from the output node d to the common node e is divided into two paths, a path I: the output node d→the output node c→the output node b→the output node a→the common node e, and a path II: the output node d→the common node e. The signals which have passed these two paths I and II are synthesized at the common node e.

Consequently, the distance from each of the output nodes a to d to the common node e is the same as that of the structure in FIG. 1, however, each wiring line resistance from each of the output nodes a to d to the common node e becomes a parallel resistance of the wiring line resistance of the propagation routes I and II.

As a result, suppose the resistance value per unit wiring distance is 1, as shown in FIG. 5(c), the wiring resistance from the output node a to the common node e is $(E^2+3DE)/(3D+2E)$, the wiring resistance from the output node b to the common node e is $(2D^2+E^2+3DE)/(3D+2E)$, the wiring resistance from the output node c to the common node e is $(2D^2+E^2+3DE)/(3D+2E)$, and the wiring resistance from the output node d to the common node e is $(E^2+3DE)/(3D+2E)$.

Consequently, when removing the inverters IV11 and IV12 from the structure in FIG. 1, the wiring resistance from the output nodes a to d, to the common node e becomes unequal, however, as compared with the conventional example in FIG. 17, the difference in wiring resistance can be decreased, and the difference in propagation delay can be reduced only by deriving wiring from the output nodes a and d of both ends, and simply connecting them to the common node e.

FIG. 6 is a circuit diagram illustrating the structure of a 4-output demultiplexer according to a fourth embodiment of the present invention.

In FIG. 6, each of the transmission gates TG11 to TG18 has an input terminal, an output terminal, a selection-signal input terminal, and an inverted-signal input terminal individually.

The transmission gates TG11, TG13, TG15, and TG17 are disposed at uniform intervals, and the transmission gates TG12, TG14, TG16, and TG18 are disposed at uniform intervals. The distance between the transmission gates TG11 and TG12, the distance between the transmission gates TG13 and TG14, the distance between the transmission gates TG15 and TG16, and the distance between the transmission gates TG17 and TG18 are equal to each other.

The transmission gates TG11 and TG12 are connected in cascade, the transmission gates TG13 and TG14 are connected in cascade, the transmission gates TG15 and TG16 are connected in cascade, and the transmission gates TG17 and TG18 are connected in cascade.

Also, input nodes a' to d' are provided at the input side of the transmission gates TG11, TG13, TG15, and TG17, respectively, and these input nodes a' to d' are connected in such a way that the wiring lengths between adjacent nodes are the same.

Also, the input nodes a' and d' of both ends are provided with an inverter IV21 and an inverter IV22, respectively, each input of IV21 and IV22 is connected to a common node e', and an input signal IN is input to the common node e' through an inverter IV23.

Here, the common node e' is disposed at the position where the wiring length from each of the inverters IV21 and IV22 is the same.

Also, an output signal A is output from the transmission gate TG12, an output signal B is output from the transmission gate TG14, an output signal C is output from the transmission gate TG16, and an output signal D is output from the transmission gate TG18.

Also, a selection input signal S1 enters the selection-signal input terminal of the transmission gate TG11, an inverted signal S1B of the selection input signal S1 enters the inverted-signal input terminal of the transmission gate TG11; a selection input signal S2 enters the selection-signal input terminal of the transmission gate TG12, an inverted signal S2B of the selection input signal S2 enters the inverted-signal input terminal of the transmission gate TG12; the selection input signal S1 enters the selection-signal input terminal of the transmission gate TG13, the inverted signal S1B of the selection input signal S1 enters the inverted-signal input terminal of the transmission gate TG13; the inverted signal S2B of the selection input signal S2 enters the selection-signal input terminal of the transmission gate TG14, the selection input signal S2 enters the inverted-signal input terminal of the transmission gate TG14; the inverted signal S1B of the selection input signal S1 enters the selection-signal input terminal of the transmission gate TG15, the selection input signal S1 enters the inverted-signal input terminal of the transmission gate TG15; the selection input signal S2 enters the selection-signal input terminal of the transmission gate TG16, the inverted signal S2B of the selection input signal S2 enters the inverted-signal input terminal of the transmission gate TG16; the inverted signal S1B of the selection input signal S1 enters the selection-signal input terminal of the transmission gate TG17, the selection input signal S1 enters the inverted-signal input terminal of the transmission gate TG17; the inverted signal S2B of the selection input signal S2 enters the selection-signal input terminal of the transmission gate TG18, and the selection input signal S2 enters the inverted-signal input terminal of the transmission gate TG18.

Then, when a 2-bit selection input signal (S1, S2)=(1, 1), the transmission gates TG11 and TG12 turn on to output the input signal IN as the output signal A; when a 2-bit selection input signal (S1, S2)=(1, 0), the transmission gates TG13 and TG14 turn on to output the input signal IN as the output signal B; when a 2-bit selection input signal (S1, S2)=(0, 1), the transmission gates TG15 and TG16 turn on to output the input signal IN as the output signal C; and when a 2-bit selection input signal (S1, S2)=(0, 0), the transmission gates TG17 and TG18 turn on to output the input signal IN as the output signal D.

Here, when the input signal IN is output as the output signal A, a signal sent from the common node e' to the input node a' is divided into two paths, a first path: the common node e'→the inverter IV21→the input node a', and a second path: the common node e'→the inverter IV22→the input node d'→the input node c'→the input node b'→the input node a'.

Then the input signal IN which has passed through these two paths is synthesized at the input node a', and is output as the output signal A through the transmission gates TG11 and TG12.

Also, when the input signal IN is output as the output signal B, a signal sent from the common node e' to the input node b' is divided into two paths, a first path: the common node e'→the inverter IV21→the input node a'→the input node b', and a second path: the common node e'→the inverter IV22→the input node d'→the input node c'→the input node b'.

Then the input signal IN which has passed through these two paths is synthesized at the input node b', and is output as the output signal B through the transmission gates TG13 and TG14.

Also, when the input signal IN is output as the output signal C, a signal sent from the common node e' to the input node c' is divided into two paths, a first path: the common node e'→the inverter IV21→the input node a'→the input node b'→the input node c', and a second path: the common node e'→the inverter IV22 →the input node d'→the input node c'.

Then the input signal IN which has passed through these two paths is synthesized at the input node c', and is output as the output signal C through the transmission gates TG15 and TG16.

Also, when the input signal IN is output as the output signal D, a signal sent from the common node e' to the input node d' is divided into two paths, a first path: the common node e'→the inverter IV21→the input node a'→the input node b'→the input node c'→the input node d', and a second path: the common node e'→the inverter IV22→the input node d'.

Then the input signal IN which has passed through these two paths is synthesized at the input node d', and is output as the output signal D through the transmission gates TG17 and TG18.

Consequently, it becomes possible to make an average value of the distance from the common node e' to each of the input nodes a' to d' identical with each other. Thus, when the input signal IN enters any one of the input nodes a' to d', the propagation delay is averaged, and the propagation delays can be identical with each other.

FIG. 7 is a circuit diagram illustrating the structure of a 4-input wired-OR circuit according to a fifth embodiment of the present invention.

In FIG. 7, four CMOS transistors, each of which includes one of P-channel MOS transistors P1 to P4 and one of N-channel MOS transistors N1 to N4 connected in series with each other, respectively. The CMOS transistors are connected in parallel between a high-level voltage and a low-level voltage, and the four CMOS transistors are disposed at uniform intervals.

Each gate of P-channel MOS transistors P1 to P4 is connected to a low-level voltage, and the P-channel MOS transistors P1 to P4 function as normally-ON loads to constitute a wired-OR circuit. Also, an input signal A enters the gate of an N-channel MOS transistor N1, an input signal B enters the gate of an N-channel MOS transistor N2, an input signal C enters the gate of an N-channel MOS transistor N3, and an input signal D enters the gate of an N-channel MOS transistor N4.

Further, output nodes a2 to d2 are disposed at positions having the same distance from each of the connection points between the P-channel MOS transistors P1 to P4 and the N-channel MOS transistors N1 to N4, respectively, and these output nodes a2 to d2 are connected so as to have the same wiring length between adjacent nodes.

Also, inverters IV31 and IV32 are disposed at the output nodes a2 and d2 of both ends, respectively, the outputs of IV31 and IV32 is connected to a common node e2, and an output signal OUT is output from the common node e2.

Here, the common node e2 is disposed at the position having the same wiring length from each of the inverters IV31 and IV32.

When one of the input signals A to D becomes a high-level, one of the N-channel MOS transistors N1 to N4 turns on, and one of the output nodes a2 to d2 corresponding to the N-channel MOS transistors N1 to N4 becomes a low-level.

Then, the signal output through the output nodes a2 to d2 is divided into a route passing the inverter IV31 and a route passing the inverter IV32, and the signal passing the IV31 and the signal passing the IV32 are synthesized at the common node e2 to be output as the output signal OUT.

Therefore, it is possible to make an average value of the distance from each of the output nodes a2 to d2 to the common node e2 identical with each other. Thus, when deriving the output signal OUT from any one of output nodes a2 to d2, the propagation delays can be averaged and made identical to each other.

FIG. 8 is a circuit diagram illustrating the structure of a 4-input wired-AND circuit according to a sixth embodiment of the present invention.

In FIG. 8, four CMOS transistors, each of which includes one of P-channel MOS transistors P1' to P4' and one of N-channel MOS transistors N1' to N4' connected in series with each other, respectively. The CMOS transistors are connected in parallel between a high-level voltage and a low-level voltage, and the four CMOS transistors are disposed at uniform intervals.

Each gate of N-channel MOS transistors N1' to N4' is connected to a high-level voltage, and the N-channel MOS transistors N1' to N4' function as normally-ON loads to constitute a wired-AND circuit. Also, an input signal A enters the gate of an P-channel MOS transistor P1', an input signal B enters the gate of an P-channel MOS transistor P2', an input signal C enters the gate of an P-channel MOS transistor P3', and an input signal D enters the gate of an P-channel MOS transistor P4'.

Further, output nodes a2' to d2' are disposed at positions having the same distance from each of the connection points between the P-channel MOS transistors P1' to P4' and the N-channel MOS transistors N1' to N4', respectively, and these output nodes a2' to d2' are connected so as to have the same wiring length between adjacent nodes.

Also, inverters IV31' and IV32' are disposed at the output nodes a2' and d2' of both ends, respectively, the outputs of IV31' and IV32' are connected to a common node e2', and an output signal OUT is output from the common node e2'.

Here, the common node e2' is disposed at a position having the same wiring length from each of the inverters IV31' and IV32'.

When one of the input signals A to D becomes a low-level, one of the P-channel MOS transistors P1' to P4' turns on, and one of the output nodes a2' to d2' corresponding to the P-channel MOS transistors P1' to P4' becomes the high-level.

Then the signal output through the output nodes a2' to d2' is divided into a route passing the inverter IV31' and a route passing the inverter IV32', and the signal passing the IV31' and the signal passing the IV32' are synthesized at the common node e2' to be output as the output signal OUT.

Therefore, it is possible to make an average value of the distance from each of the output nodes a2' to d2' to the common node e2' identical with each other. Thus, when deriving the output signal OUT from any one of output nodes a2' to d2', the propagation delay can be averaged and made identical to each other.

FIG. 9 is a circuit diagram illustrating the structure of a 4-input pulse-processing circuit according to a seventh embodiment of the present invention.

In FIG. 9, the pulse-processing circuit is composed of N=4 pieces of circuit blocks BL1 to BL4 corresponding to N=4 pieces of non-overlap pulses S1 to S4. Also, these circuit blocks BL1 to BL4 are disposed at uniform intervals, and in each of the circuit blocks BL1 to BL4, two P-channel MOS transistors connected with each other in series and two N-channel MOS transistors connected with each other in series are provided.

Specifically, in each of the circuit blocks BL1 to BL4, between a high-level voltage and each of the output terminals, P-channel MOS transistors P11 to P14 and P-channel MOS transistors P11' to P14' are connected in series, respectively, and between each of the output terminals and a low-level voltage, N-channel MOS transistors N11 to N14 and N-channel MOS transistors N11' to N14' are connected in series, respectively.

Also, non-overlap pulses S1 to S4 are input to the gates of the P-channel MOS transistors P11 to P14 and N-channel MOS transistors N11 to N14, respectively. At the same time, non-overlap pulses S1 to S4 are input to the gates of the P-channel MOS transistors P11' to P14' and N-channel MOS transistors N11' to N14' through the inverters IV41 to IV44, respectively.

Here, each of the inverters IV41 to IV44 inverts non-overlap pulses S1 to S4, and ensures a delay time of non-overlap pulses S1 to S4. In order to ensure the necessary delay time, the inverters IV41 to IV44 can be intentionally designed at lower drive capability.

In this regard, in the example in FIG. 9, a description has been given of the method of disposing one stage of inverters IV41 to IV44 in front of the gates of P-channel MOS transistors P11' to P14' and N-channel MOS transistors N11' to N14'. However, in order to adjust the delay amount of non-overlap pulses S1 to S4, an odd number of stages of inverters may be connected in front of the gates of P-channel MOS transistors P11' to P14' and N-channel MOS transistors N11' to N14'.

Also, output nodes a3 to d3 are disposed at a position having an equal distance from the output terminals of each of the circuit blocks BL1 to BL4, and these output nodes a3 to d3 are connected so as to have the same wiring length between adjacent nodes.

Also, inverters IV51 and IV52 are disposed at the output nodes a3 and d3 of both ends, respectively, each output of IV51 and IV52 is connected to a common node e3, and an output signal OUT is output from the common node e3.

Here, the common node e3 is disposed at a position having the same wiring length from each of the inverters IV51 and IV52.

FIG. 10 is a timing chart illustrating the operation of a 4-input pulse-processing circuit according to a seventh embodiment of the present invention.

At time T1 in FIG. 10, when the non-overlap pulse S1 changes from a low-level to a high-level, the P-channel MOS transistor P11 turns off, and the N-channel MOS transistor N11 turns on.

At the same time, non-overlap pulse S1 is input to the gates of the P-channel MOS transistor P11' and the N-channel MOS transistor N11' through the inverters IV41. The level change of the inverted signal S1B of the non-overlap pulse S1 comes with a delay time t of the inverter IV41, and thus at time T1, the gates of the P-channel MOS transistor P11' and the N-channel MOS transistor N11' remain at a high-level.

As a result, the P-channel MOS transistor P11' is kept in an OFF state, and the N-channel MOS transistor N11' is kept in an ON state.

Consequently, the path between the high-level voltage and the output terminal of the circuit block BL1 becomes non-conductive, the path between the output terminal of the circuit block BL1 and the low-level voltage becomes conductive, and thus an output signal OUTB1 of the circuit block BL1 changes from a high-level to a low-level.

At the same time, at time T1, non-overlap pulses S2 to S4, which are input into the other circuit blocks BL2 to BL4, are kept at a low-level, the inverted signals S2B to S4B of the non-overlap pulses S2 to S4 are kept at a high-level, and thus the P-channel MOS transistors P12' to P14' and the N-channel MOS transistors N12 to N14 are kept off.

Thus the output terminals of the circuit blocks BL2 to BL4 are blocked from both the low-level voltage and the high-level voltage, and the output terminals of the circuit blocks BL2 to BL4 are kept in a floating state.

As a result, at time T1, the levels of the output signals OUTB1 to OUTB4 of all the circuit blocks BL1 to BL4 are regulated by the level of the output signal OUTB1 of the circuit block BL1. When the output signal OUTB1 of the circuit block BL1 changes from a high-level to a low-level, the output signals OUTB2 to OUTB4 of the other circuit blocks BL2 to BL4 change from a high-level to a low-level.

Here, the output signal OUTB1 of the circuit block BL1 is divided, at the output node a3, into a path passing through the inverter IV51 and a path passing through the inverter IV52, and the signal which has passed through the inverter IV51 and the signal which has passed through the inverter IV52 is synthesized at the node e3 to be output as an output signal OUT.

The output signal OUTB1 from the circuit block BL1 is inverted by the inverters IV51 and IV52, and thus the output signal OUT changes from a low-level to a high-level.

Next, at time T2, which has passed for a delay time t from time T1 by the inverter IV41, the level change of the inverted signal S1B of the non-overlap pulse S1 is transmitted to the gates of the P-channel MOS transistor P11' and the N-channel MOS transistor N11', and the gates of the P-channel MOS transistor P11' and the N-channel MOS transistor N11' change from a high-level to a low-level.

As a result, the P-channel MOS transistor P11' turns on and the N-channel MOS transistor N11' turns off. Thus the path between the high-level voltage and the output terminal of the circuit block BL1 remains non-conductive, and the path between the output terminal of the circuit block BL1 and the low-level voltage becomes non-conductive.

Consequently, the output terminal of the circuit block BL1 changes to a floating state, and by a charge-conservation behavior of the parasitic capacitance which exists in the output terminal of the circuit block BL1, the output signal OUTB1 of the circuit block BL1 keeps a low-level and the output signal OUT keeps a high-level.

Next, at time T3, when the non-overlap pulse S1 changes from a high-level to a low-level, the P-channel MOS transistor P11 turns on and the N-channel MOS transistor N11 turns off.

At the same time, non-overlap pulse S1 is input to the gates of the P-channel MOS transistor P11' and the N-channel MOS transistor N11' through the inverters IV41. The level change of the inverted signal S1B of the non-overlap pulse S1 comes with a delay time t of the inverter IV41, and thus at time T3, the gates of the P-channel MOS transistor P11' and the N-channel MOS transistor N11' remain at the low-level.

As a result, the P-channel MOS transistor P11' is kept in an ON state, and the N-channel MOS transistor N11' is kept in an OFF state.

Consequently, the path between the high-level voltage and the output terminal of the circuit block BL1 becomes conductive, the path between the output terminal of the circuit block BL1 and the low-level voltage becomes non-conductive, and thus the output signal OUTB1 of the circuit block BL1 changes from a low-level to a high-level.

At the same time, at time T3, non-overlap pulses S2 to S4, which are input into the other circuit blocks BL2 to BL4, are kept at the low-level, the inverted signals S2B to S4B of the non-overlap pulses S2 to S4 are kept at the high-level, and thus the P-channel MOS transistors P12' to P14' and the N-channel MOS transistors N12 to N14 are kept off.

Thus the output terminals of the circuit blocks BL2 to BL4 are blocked from both the low-level voltage and the high-level voltage, and the output terminals of the circuit blocks BL2 to BL4 are kept in a floating state.

As a result, at time T3, the levels of the output signals OUTB1 to OUTB4 of all the circuit blocks BL1 to BL4 are regulated by the level of the output signal OUTB1 of the circuit block BL1. When the output signal OUTB1 of the circuit block BL1 changes from the low-level to the high-level, the output signals OUTB2 to OUTB4 of the other circuit blocks BL2 to BL4 change from the low-level to the high-level.

Here, the output signal OUTB1 of the circuit block BL1 is divided, at the output node a3, into a path passing through the inverter IV51 and a path passing through the inverter IV52, and the signal which has passed through the inverter IV51 and the signal which has passed through the inverter IV52 is synthesized at the node e3 to be output as an output signal OUT.

The output signal OUTB1 which has been out from the circuit block BL1 is inverted by the inverters IV51 and IV52, and thus the output signal OUT changes from a high-level to a low-level.

Next, at time T4, which has passed for a delay time t from time T3, the level change of the non-overlap pulse S1 is transmitted to the gates of the P-channel MOS transistor P11' and the N-channel MOS transistor N11', and the gates of the P-channel MOS transistor P11' and the N-channel MOS transistor N11' change from a low-level to a high-level.

As a result, the P-channel MOS transistor P11' turns off and the N-channel MOS transistor N11' turns on. Thus the path between the output terminal of the circuit block BL1 and the low-level voltage remains non-conductive, and the path between the output terminal of the circuit block BL1 and the high-level voltage becomes non-conductive.

Consequently, the output terminal of the circuit block BL1 changes to a floating state, and by the charge-conservation behavior of the parasitic capacitance which exists in the output terminal of the circuit block BL1, the output signal OUTB1 of the circuit block BL1 keeps a high-level and the output signal OUT keeps a low-level.

The other non-overlap pulses S2 to S4 are processed by the circuit blocks BL2 to BL4 (at time T5 to T16) in the same way as the operation of the circuit blocks BL1.

Consequently, in the pulse-processing circuit in FIG. 9, when the level of any one of the non-overlap pulses S1 to S4 becomes a high-level, any one of the circuit blocks BL1 to BL4 causes the corresponding one of output nodes a3 to d3 to change to a low-level. When the level of any one of the non-overlap pulses S1 to S4 becomes a low-level, any one of the circuit blocks BL1 to BL4 causes the corresponding one of output nodes a3 to d3 to change to a high-level.

Then the signal output to the output nodes a3 to d3 is divided into a path passing through the inverter IV51 and a path passing through the inverter IV52, and the signal which has passed through the inverter IV51 and the signal which has passed through the inverter IV52 are synthesized at the common node e3 to be output as an output signal OUT.

Consequently, even when a wiring length from the output terminal of each of the circuit blocks BL1 to BL4 is different, it becomes possible to perform a logical sum of the non-overlap pulses S1 to S4 while restraining jitter.

When the number of non-overlap pulses is increased, the pulse-processing circuit in FIG. 9 can perform a logical sum of the non-overlap pulses without increasing the number of transistors connected in series between the high-level voltage and the low-level voltage, and a low-voltage IC process can be easily applied.

Also, by connecting four transistors in series, when the levels of the non-overlap pulses S1 to S4 change, it becomes possible to prevent flowing of a penetrating current between a high-level voltage and a low-level voltage, and thus power consumption can be reduced.

Furthermore, the circuit can function as a 4-input pulse processing circuit only by connecting four pieces of the blocks corresponding to each of the non-overlap pulses S1 to S4, and it is possible to maintain an input symmetric structure of the non-overlap pulses S1 to S4.

Consequently, in the case where the pulse-processing circuit in FIG. 9 is applied to a clock-multiplier circuit, it becomes possible to restrain an increase of jitter without paying special attention to circuit layout, and to increase the number of input terminals of the non-overlap pulses without increasing the power supply voltage, and thus an N times frequency clock can be easily obtained.

FIG. 11 is a block diagram illustrating the structure of a clock-multiplier circuit according to an eighth embodiment of the present invention.

In FIG. 11, the clock-multiplier circuit is provided with a multiphase-clock generation circuit CG, RS flip-flops FF1 to FF4, and the pulse-processing circuit PS in FIG. 9.

Here, as shown in FIG. 12, the multiphase-clock generation circuit CG receives the input of a reference signal Sref, and is capable of outputting eight phases of multiphase-clocks Ck1 to Ck8 having phases shifted for each one-eighth period.

Then the multiphase-clocks Ck1 and Ck2 enter the RS flip-flop FF1, the multiphase-clocks Ck3 and Ck4 enter the RS flip-flop FF2, the multiphase-clocks Ck5 and Ck6 enter the RS flip-flop FF3, and the multiphase-clocks Ck7 and Ck8 enter the RS flip-flop FF4.

Then each of the RS flip-flops FF1 to FF4 detects the rising edges of each of the multiphase-clocks Ck1 to Ck8, and outputs non-overlap pulses S1 to S4 corresponding to a phase shift of each of the multiphase-clocks Ck1 to Ck8.

The non-overlap pulses S1 to S4 are output to the pulse-processing circuit PS individually, and the pulse-processing circuit PS performs a logical sum of the non-overlap pulses S1 to S4.

As a result, as shown in FIG. 10, a clock signal having a frequency that is four times that of the reference signal Sref can be output as an output signal OUT.

In this regard, for a multiphase-clock generation circuit CG, a DLL circuit or a PLL circuit can be used.

Here, by using a DLL circuit, a four times frequency multiplied clock can be generated without using an oscillator, and thus it becomes possible to prevent the generation of low-frequency noises inherent to oscillators.

FIG. 13 is a block diagram illustrating the structure of the multiphase-clock generation circuit used for the clock multiplier circuit in FIG. 11.

In FIG. 13, the multiphase-clock generation circuit CG in FIG. 11 is provided with a phase detector PD, a charge-pump circuit CP, a capacitor C, and delay circuits H1 to H8, constituting a DLL circuit.

Here, the delay circuits H1 to H8 are connected in cascade, the delay circuits H1 to H8 output the multiphase-clocks Ck1 to Ck8, also the reference signal Sref is input into the first stage of the delay circuits H1 to H8, and the last signal Ck8 of the delay circuits H1 to H8 is fed back to the phase detector PD.

Then the signal Ck8, which is fed back to the phase detector PD is compared with the reference signal Sref by the phase detector PD, and an Up signal or a Down signal is output to the charge-pump circuit CP corresponding to the phase difference between the signal Ck8 and the reference signal Sref.

When the charge-pump circuit CP receives the Up signal output, the capacitor C is charged, and when it receives the Down signal output, the charge stored in the capacitor C is discharged. The voltage defined by the charge stored in the capacitor C is output to each of the delay circuits H1 to H8 as a control voltage Vc.

Each of the delay circuits H1 to H8 changes the delay amount depending on the control voltage Vc, and the multiphase-clocks Ck1 to Ck8, which are output from each of the delay circuits H1 to H8, is controlled so that the signal Ck8 matches the reference signal Sref in phase.

As a result, as shown in FIG. 12, eight phases of the multiphase-clock Ck1 to Ck8 having phases shifted one-eighth period with each other can be generated.

FIG. 14 is a circuit diagram illustrating the structure of a multiphase-clock processing circuit according to a ninth embodiment of the present invention.

In FIG. 14, the multiphase-clock processing circuit consists of N=4 circuit blocks BL11 to BL14 corresponding to 2N=2×4=8 multiphase-clock signals Ck1 to Ck8. Also, these circuit blocks BL11 to BL14 are disposed at uniform intervals, and in each of the circuit blocks BL11 to BL14, two P-channel MOS transistors connected with each other in series and two N-channel MOS transistors connected with each other in series are provided.

Specifically, in each of the circuit blocks BL11 to BL14, between a high-level voltage and each of the output terminals, P-channel MOS transistors P21 to P24 and P-channel MOS transistors P21' to P24' are connected in series, respectively, and between the output terminals and a low-level voltage, N-channel MOS transistors N21 to N24 and N-channel MOS transistors N21' to N24' are connected in series, respectively.

Here, the inverted signal Ck1B of the clock signal Ck1 is input into the gate of the P-channel MOS transistor P21, and the inverted signal Ck1B of the clock signal Ck1 is input into the gate of the P-channel MOS transistor P21' through an inverter IV61.

Also, the clock signal Ck2 is input into the gate of the N-channel MOS transistor N21, and the clock signal Ck2 is input into the gate of the N-channel MOS transistor N21' through an inverter IV62.

Also, the inverted signal Ck3B of the clock signal Ck3 is input into the gate of the P-channel MOS transistor P22, and the inverted signal Ck3B of the clock signal Ck3 is input into the gate of the P-channel MOS transistor P22' through an inverter IV63.

Also, the clock signal Ck4 is input into the gate of the N-channel MOS transistor N22, and the clock signal Ck4 is input into the gate of the N-channel MOS transistor N22' through an inverter IV64.

Also, the inverted signal Ck5B of the clock signal Ck5 is input into the gate of the P-channel MOS transistor P23, and the inverted signal Ck5B of the clock signal Ck5 is input into the gate of the P-channel MOS transistor P23' through an inverter IV65.

Also, the clock signal Ck6 is input into the gate of the N-channel MOS transistor N23, and the clock signal Ck6 is input into the gate of the N-channel MOS transistor N23' through an inverter IV66.

Also, the inverted signal Ck7B of the clock signal Ck7 is input into the gate of the P-channel MOS transistor P24, and the inverted signal Ck7B of the clock signal Ck7 is input into the gate of the P-channel MOS transistor P24' through an inverter IV67.

Also, the clock signal Ck8 is input into the gate of the N-channel MOS transistor N24, and the clock signal Ck8 is input into the gate of the N-channel MOS transistor N24' through an inverter IV68.

Here, the inverters IV61 to IV68 invert the clock signals Ck2, Ck4, Ck6, and Ck8, and the inverted signals Ck1B, Ck3B, Ck5B, and Ck7B. Also, in order to ensure a necessary delay time of the input signal, the inverters IV61 to IV68 can be intentionally designed at lower drive capability.

In this regard, in the example in FIG. 14, a description has been given of the method of inputting an input signal into each gate of the P-channel MOS transistors P21' to P24' and the N-channel MOS transistors N21' to N24' through one stage of inverters IV61 to IV68, respectively. However, in order to adjust the delay amount of these input signals, the input signal may be individually input into each gate of the P-channel MOS transistors P21' to P24' and N-channel MOS transistors N21' to N24' through an odd number of inverters.

Also, in the example in FIG. 14, a description has been given of the method of disposing the inverters IV61 to IV68 at each gate of the P-channel MOS transistors P21' to P24' and the N-channel MOS transistors N21' to N24', respectively. However, the inverters IV61 to IV68 may be disposed at each gate of the P-channel MOS transistors P21 to P24 and the N-channel MOS transistors N21 to N24, respectively.

Also, output nodes a4 to d4 are disposed at the position having an equal distance from the output terminals of each of the circuit blocks BL11 to BL14, and these output nodes a4 to d4 are connected so as to have the same wiring length between adjacent nodes.

Also, inverters IV71 and IV72 are disposed at the output nodes a4 and d4 of both ends, respectively, each output of IV71 and IV72 is connected to a common node e4, and an output signal OUT is output from the common node e4.

Here, the common node e4 is disposed at the position having the same wiring length from each of the inverters IV71 and IV72.

FIG. 15 is a timing chart illustrating the operation of the multiphase-clock processing according to a ninth embodiment of the present invention. In this regard, in the following description, the delay time of each of the inverters IV61 to IV 68 is assumed to be set to t.

At time t1 in FIG. 15, when the clock signal Ck1 rises (that is, when the signal changes from a low-level to a high-level), the inverted signal Ck1B falls (that is, the signal changes from a high-level to a low-level).

Then the inverted signal Ck1B enters the gate of the P-channel MOS transistor P21, and thus the P-channel MOS transistor P21 turns on.

At the same time, the inverter IV61 is connected to the gate of the P-channel MOS transistor P21', and the inverted signal Ck1B enters the gate of the P-channel MOS transistor P21' through the inverter IV61.

Thus the clock signal Ck1', which enters the gate of the P-channel MOS transistor P21', rises (that is, changes from a low-level to a high-level) with a delay time of t from time t1 when the inverted signal Ck1B falls, and, at time t1, the gate of the P-channel MOS transistor P21' remains at a low-level.

As a result, at time t1, the P-channel MOS transistor P21 turns on, the P-channel MOS transistor P21' is kept in an ON state, and the output terminal of the circuit block BL11 is conductive to a high-level voltage.

On the other hand, at time t1, the level of the clock signal Ck2 is in a steady state, and at least one of the N-channel MOS transistors N21 and N21' turns off, thus the output terminal of the circuit block BL11 is blocked from the low-level voltage.

At the same time, at time t1, the clock signals Ck3 to Ck8 of the other circuit blocks BL12 to BL14 are in a steady state except the clock signal Ck5. Also, at time t1, the clock signal Ck5' which is input into the gate of the P-channel MOS transistors P23' is a high-level, and thus the P-channel MOS transistors P23' is off.

Thus, at time t1, each of the output terminals of the circuit blocks BL12 to BL14 is blocked from both the low-level voltage and the high-level voltage, and is kept in a floating state.

As a result, when the output terminals of the circuit blocks BL11 to BL14 are commonly connected, at time t1, the output of the output terminal of the circuit block BL11 can be prevented from interfering with the output of the circuit blocks BL12 to BL14, and the output OUTB of all the circuit blocks BL11 to BL14 can be defined by the output signal of the output terminal of the circuit block BL11.

Here, the output signal of the circuit block BL11 is divided, at the output node a4, into a path passing through the inverter IV71 and a path passing through the inverter IV72, and the signal which has passed through the inverter IV71 and the signal which has passed through the inverter IV72 are synthesized at the node e4 to be output as an output signal OUT.

The output signal OUTB from the circuit block BL11 is inverted by the inverters IV71 and IV72, and thus the output signal OUT changes from a high-level to a low-level.

Next, at time t2 which has passed a delay time of t from time t1, the clock signal Ck1', which has been delayed by the inverter IV61, rises, and the gate of the P-channel MOS transistors P21' becomes a high-level, thus the P-channel MOS transistors P21' turns off.

As a result, the output terminal of the circuit block BL11 is blocked from the high-level voltage, and the output terminal of the circuit block BL11 goes into a floating state.

Here, the output terminal of the circuit block BL11 has a parasitic capacitance, and when the output terminal of the circuit block BL11 goes into a floating state, by the charge-conservation behavior of the parasitic capacitance, the output OUTB of all the circuit blocks BL11 to BL14 can keep a high-level and the multiplier clock OUT can keep a low-level.

Next, at time t3, when the clock signal Ck2 rises (that is, when the signal changes from a low-level to a high-level), the clock signal Ck2 enters the gate of the N-channel MOS transistor N21, and thus the N-channel MOS transistor N21 turns on.

At the same time, the inverter IV62 is connected to the gate of the N-channel MOS transistor N21', and the clock signal Ck2 enters the gate of the N-channel MOS transistor N21' through the inverter IV62.

Thus the clock signal Ck2B', which enters the gate of the N-channel MOS transistor N21', falls (that is, changes from a high-level to a low-level) with a delay time of t from time t3 when the clock signal Ck2 rises, and, at time t3, the gate of the N-channel MOS transistor N21' remains at a high-level.

As a result, at time t3, the N-channel MOS transistor N21 turns on, the N-channel MOS transistor N21' is kept in an ON state, and the output terminal of the circuit block BL11 is conductive to a low-level voltage.

On the other hand, at time t3, the level of the clock signal Ck1 is in a steady state, and at least one of the P-channel MOS transistors P21 and P21' turns off, thus the output terminal of the circuit block BL11 is blocked from the high-level voltage.

At the same time, at time t3, the clock signals Ck3 to Ck8 of the other circuit blocks BL12 to BL14 are in a steady state except the clock signal Ck6. Also, at time t3, the inverted signal Ck6B' which is input into the gate of the N-channel MOS transistors N23' is a low-level, and thus the N-channel MOS transistors N23' is off.

Thus, at time t3, each of the output terminals of the circuit blocks BL12 to BL14 is blocked from both a high-level voltage and a low-level voltage, and is kept in a floating state.

As a result, when the output terminals of the circuit blocks BL11 to BL14 are commonly connected, at time t3, the output of the output terminal of the circuit block BL11 can be prevented from interfering with the output of the circuit blocks BL12 to BL14, the output OUTB of all the circuit blocks BL11 to BL14 can be defined by the output signal of the output terminal of the circuit block BL11.

Here, the output signal of the circuit block BL11 is divided, at the output node a4, into a path passing through the inverter IV71 and a path passing through the inverter IV72, and the signal which has passed through the inverter IV71 and the signal which has passed through the inverter IV72 are synthesized at the node e4 to be output as an output signal OUT.

The output signal from the circuit block BL11 is inverted by the inverters IV71 and IV72, and thus the output signal OUT changes from a low level to a high level.

Next, at time t4 which has passed a delay time of t from time t3, the clock signal Ck2B', which has been delayed by the inverter IV62, falls, and the gate of the N-channel MOS transistors N21' becomes a low-level, thus the N-channel MOS transistors N21' turns off.

As a result, the output terminal of the circuit block BL11 is blocked from the low-level voltage, and the output terminal of the circuit block BL11 goes into a floating state.

Here, the output terminal of the circuit block BL11 has a parasitic capacitance, and even when the output terminal of the circuit block BL11 goes into a floating state, by the charge-conservation behavior of the parasitic capacitance, the output OUTB of all the circuit blocks BL11 to BL14 can keep a low-level and the multiplied clock OUT can keep a high-level.

For the other clock signals Ck3 to Ck8, the same operation is repeated by the circuit blocks BL12 to BL14.

Consequently, in the multiphase-clock processing circuit in FIG. 14, every time the multiphase-clock CK1 to CK8 rises in sequence, the circuit blocks BL11 to BL14 output signals to the corresponding output nodes a4 to d4.

Then, the signal output to the output nodes a4 to d4 is divided into a path passing through the inverter IV71 and a path passing through the inverter IV72, and the signal which has passed through the inverter IV71 and the signal which has passed through the inverter IV72 are synthesized at the node e4 to be output as an output signal OUT.

Consequently, even when a wiring length from the output terminal of each of the circuit blocks BL11 to BL14 is different, it becomes possible to generate a multiplied clock having a frequency four times that of the multiphase-clock Ck1 to Ck8 while restraining jitter.

In this manner, after the level of each output terminal of each of the circuit blocks BL11 to BL14 has changed, the output terminals are set to be in a floating state, and the propagation delay is averaged. This means that even when the output terminals of the circuit blocks BL11 to BL14, which have a different wiring length, are commonly connected, it becomes possible to use the output of each of the circuit blocks BL11 to BL14 as an output of all the circuit blocks BL11 to BL14, and to restrain jitter, while preventing the interference of the output of each of the circuit blocks BL11 to BL14.

When the number of phases of the multiphase-clock is increased in the multiphase-clock processing circuit in FIG. 14, it is not necessary to increase the number of transistors connected in series, and thus a low-voltage IC process can be easily applied.

Also, when the number of phases of the multiphase-clock is increased, it is only necessary to simply connect circuit blocks BL11 to BL14 in parallel. Also, it becomes possible to maintain a symmetric structure of each input terminal, and thus a higher clock frequency can be achieved while restraining an increase of jitter.

Also, only by using rising edges of the multiphase-clock Ck1 to Ck8, it becomes possible to directly generate a multiplied clock OUT, and thus RS flip-flops becomes unnecessary in order to generate a non-overlap pulse from the multiphase-clock Ck1 to Ck8.

Consequently, when the number of input terminals of the multiphase-clock Ck1 to Ck8 increases, it becomes possible to prevent an increase in circuit size, to restrain an increase of a chip area and power consumption. Also, it becomes possible to reduce mismatching of each of the circuit blocks BL11 to BL14 among each phase of the multiphase-clock Ck1 to Ck8, and to restrain jitter.

Furthermore, by generating a multiplied clock OUT using only rising edges of the multiphase-clock Ck1 to Ck8, it becomes possible to maintain the duty ratio of the multiplied clock OUT at 50% even when the duty ratio of the multiphase-clock Ck1 to Ck8 deviates from 50%. Also, it is possible to prevent the duty ratio of the multiplied clock OUT from failing off from 0% or exceeding 100% and to prevent disappearance of the pulses.

In this regard, in order to prevent the interference of the output among the circuit blocks BL11 to BL14 when the output terminals of the circuit blocks BL11 to BL14 are commonly connected, it is necessary that each delay amount t of the inverters IV61 to IV68 is set to be smaller than a shift amount ($\pi/N$) of the multiphase-clock.

FIG. 16 is a block diagram illustrating the structure of the clock-multiplier circuit according to a tenth embodiment of the present invention.

In FIG. 16, the clock-multiplier circuit is provided with a multiphase-clock generation circuit CG, inverters IV81 to IV84, and the multiphase-clock processing circuit CS in FIG. 14.

Here, for the multiphase-clock generation circuit CG, a DLL circuit or a PLL circuit can be used, and, for example, the structure in FIG. 13 can be used.

Then the multiphase-clock generation circuit CG receives a reference signal Sref at its input, and produces eight phases of the multiphase-clock Ck1 to Ck8 having phases shifted one-eighth period relative to one another.

Then the multiphase-clocks Ck2, Ck4, Ck6, and Ck8, which have been output from the multiphase-clock generation circuit CG, are directly input into the multiphase-clock processing circuit CS. The multiphase-clocks Ck1, Ck3, Ck5, and Ck7, which have been output from the multiphase-clock generation circuit CG, are input into the multiphase-clock processing circuit CS through the inverters IV81 to IV84, respectively.

As a result, as shown in FIG. 15, it is possible to output a clock signal having a frequency four times as that of the reference signal Sref as an output signal OUT.

As described above, by the present invention, in various electronic circuits including gate circuits, it becomes possible to make the propagation delay time of each signal path substantially the same. Thus, while keeping versatility for various electronic circuits, it becomes possible to make the propagation delay time of each signal path substantially the same, and, at the same time, using a low resistance process becomes unnecessary, and it becomes possible to lower manufacturing costs.

The entire disclosure of Japanese Application No. 2002-029953, filed Feb. 6, 2002 is incorporated by reference.

What is claimed is:

1. An output circuit comprising:
   an array of signal output terminals disposed at uniform intervals relative to one another within the array;
   a first connection line which connects adjacent signal output terminals with each other;
   a second connection line which connects the signal output terminals at both ends of the array; and
   a common output terminal disposed at a middle point of the second connection line.

2. An output circuit according to claim 1,
   wherein buffer circuits are disposed on the second connection line in the vicinities of the signal output terminals at both ends.

* * * * *